United States Patent
Han et al.

(10) Patent No.: US 10,896,818 B2
(45) Date of Patent: Jan. 19, 2021

(54) STACKING FAULT-FREE SEMIPOLAR AND NONPOLAR GAN GROWN ON FOREIGN SUBSTRATES BY ELIMINATING THE NITROGEN POLAR FACETS DURING THE GROWTH

(71) Applicant: Yale University, New Haven, CT (US)

(72) Inventors: Jung Han, Woodbridge, CT (US); Jie Song, New Haven, CT (US)

(73) Assignee: Yale University, New Haven, CT (US)

( * ) Notice: Subject to any disclaimer, the term of this patent is extended or adjusted under 35 U.S.C. 154(b) by 0 days.

(21) Appl. No.: 16/324,979

(22) PCT Filed: Aug. 11, 2017

(86) PCT No.: PCT/US2017/046484
§ 371 (c)(1),
(2) Date: Feb. 12, 2019

(87) PCT Pub. No.: WO2018/031876
PCT Pub. Date: Feb. 15, 2018

(65) Prior Publication Data
US 2019/0228969 A1     Jul. 25, 2019

Related U.S. Application Data

(60) Provisional application No. 62/374,643, filed on Aug. 12, 2016, provisional application No. 62/374,666, filed on Aug. 12, 2016.

(51) Int. Cl.
*H01L 21/02* (2006.01)
*C30B 29/40* (2006.01)
(Continued)

(52) U.S. Cl.
CPC ...... *H01L 21/02694* (2013.01); *C23C 16/042* (2013.01); *C23C 16/303* (2013.01);
(Continued)

(58) Field of Classification Search
None
See application file for complete search history.

(56) References Cited

U.S. PATENT DOCUMENTS

| 4,948,456 A | 8/1990 | Schubert |
| 4,952,526 A | 8/1990 | Pribat et al. |

(Continued)

FOREIGN PATENT DOCUMENTS

| CN | 101743618 A | 6/2010 |
| CN | 102119243 A | 7/2011 |

(Continued)

OTHER PUBLICATIONS

International Search Report and Written Opinion for International Application No. PCT/US2015/025899 dated Jul. 7, 2015.

(Continued)

*Primary Examiner* — Steven B Gauthier
(74) *Attorney, Agent, or Firm* — Wolf, Greenfield & Sacks, P.C.

(57) ABSTRACT

Methods and structures for forming epitaxial layers of Ill-nitride materials on patterned foreign substrates with low stacking fault densities are described. Semipolar and nonpolar orientations of GaN that are essentially free from stacking faults may be grown from crystal-growth facets of a patterned substrate. Etching can be used to remove stacking faults if present. Crystal growth with an impurity can eliminate crystal growth from a facet that is responsible for stacking fault formation and permit substantially stacking-fault-free growth of the Ill-nitride material.

13 Claims, 10 Drawing Sheets

(51) Int. Cl.
*H01L 33/00* (2010.01)
*H01L 21/306* (2006.01)
*C30B 25/18* (2006.01)
*C23C 16/04* (2006.01)
*C23C 16/30* (2006.01)
*C23C 16/56* (2006.01)
*C30B 25/04* (2006.01)
*C30B 33/10* (2006.01)
*H01L 29/04* (2006.01)
*H01L 29/20* (2006.01)
*H01L 29/207* (2006.01)
*H01L 29/32* (2006.01)
*H01L 29/36* (2006.01)
*H01L 33/02* (2010.01)
*H01L 33/12* (2010.01)
*H01L 33/20* (2010.01)
*H01L 33/32* (2010.01)

(52) U.S. Cl.
CPC .............. *C23C 16/56* (2013.01); *C30B 25/04* (2013.01); *C30B 25/18* (2013.01); *C30B 25/186* (2013.01); *C30B 29/406* (2013.01); *C30B 33/10* (2013.01); *H01L 21/0242* (2013.01); *H01L 21/0243* (2013.01); *H01L 21/0254* (2013.01); *H01L 21/0257* (2013.01); *H01L 21/0262* (2013.01); *H01L 21/02433* (2013.01); *H01L 21/02458* (2013.01); *H01L 21/02576* (2013.01); *H01L 21/02609* (2013.01); *H01L 21/02639* (2013.01); *H01L 21/02647* (2013.01); *H01L 21/30612* (2013.01); *H01L 21/30617* (2013.01); *H01L 29/045* (2013.01); *H01L 29/2003* (2013.01); *H01L 29/207* (2013.01); *H01L 29/32* (2013.01); *H01L 29/36* (2013.01); *H01L 33/007* (2013.01); *H01L 33/025* (2013.01); *H01L 33/12* (2013.01); *H01L 33/20* (2013.01); *H01L 33/325* (2013.01)

(56) References Cited

U.S. PATENT DOCUMENTS

| | | | |
|---|---|---|---|
| 5,356,510 A | 10/1994 | Pribat et al. | |
| 5,587,014 A | 12/1996 | Iyechika et al. | |
| 5,888,853 A | 3/1999 | Gardner et al. | |
| 6,617,668 B1 | 9/2003 | Koide et al. | |
| 7,390,750 B1 | 6/2008 | Ramkumar et al. | |
| 7,727,874 B2 | 6/2010 | Hanser et al. | |
| 8,252,684 B1 | 8/2012 | Lee et al. | |
| 8,482,103 B2 | 7/2013 | Liu et al. | |
| 8,698,173 B2 | 4/2014 | Goswami | |
| 9,711,352 B2 | 7/2017 | Han et al. | |
| 9,978,589 B2 | 5/2018 | Han et al. | |
| 9,978,845 B2 | 5/2018 | Han et al. | |
| 2002/0179911 A1 | 12/2002 | Linthicum et al. | |
| 2002/0189534 A1 | 12/2002 | Tang et al. | |
| 2003/0211713 A1 | 11/2003 | Suguro et al. | |
| 2004/0175844 A1 | 9/2004 | Yang et al. | |
| 2004/0261692 A1 | 12/2004 | Dwilinski et al. | |
| 2005/0184307 A1 | 8/2005 | Li et al. | |
| 2006/0131606 A1 | 6/2006 | Cheng | |
| 2006/0292719 A1 | 12/2006 | Lochtefeld et al. | |
| 2007/0017439 A1 | 1/2007 | Xianyu et al. | |
| 2007/0080369 A1 | 4/2007 | Sakai | |
| 2008/0042543 A1 | 2/2008 | Conrad | |
| 2008/0093622 A1 | 4/2008 | Li et al. | |
| 2009/0001416 A1 | 1/2009 | Chua et al. | |
| 2009/0032799 A1 | 2/2009 | Pan | |
| 2009/0098343 A1 | 4/2009 | Arena et al. | |
| 2010/0012948 A1 | 1/2010 | Usikov et al. | |
| 2010/0102307 A1 | 4/2010 | Chua et al. | |
| 2010/0117188 A1 | 5/2010 | Waldrab et al. | |
| 2010/0171176 A1 | 7/2010 | Wells | |
| 2010/0187568 A1 | 7/2010 | Arena | |
| 2010/0210067 A1 | 8/2010 | Butcher | |
| 2011/0045658 A1 | 2/2011 | Liu et al. | |
| 2011/0065264 A1 | 3/2011 | Moffatt et al. | |
| 2011/0092052 A1 | 4/2011 | Ueno | |
| 2011/0204329 A1 | 8/2011 | Craven et al. | |
| 2011/0227198 A1 | 9/2011 | Wunderer et al. | |
| 2011/0244663 A1 | 10/2011 | Su | |
| 2011/0254134 A1 | 10/2011 | Detchprohm et al. | |
| 2011/0292957 A1 | 12/2011 | Bhat et al. | |
| 2012/0025195 A1 | 2/2012 | McComber et al. | |
| 2012/0043528 A1 | 2/2012 | Lo et al. | |
| 2012/0098102 A1 | 4/2012 | Imer et al. | |
| 2012/0104558 A1 | 5/2012 | Ishibashi | |
| 2012/0112603 A1 | 5/2012 | Masaki | |
| 2012/0115293 A1 | 5/2012 | Noh et al. | |
| 2012/0146190 A1 | 6/2012 | Liu et al. | |
| 2013/0001682 A1 | 1/2013 | Tang et al. | |
| 2013/0015492 A1 | 1/2013 | Hashimoto et al. | |
| 2013/0029472 A1 | 1/2013 | Park et al. | |
| 2013/0214248 A1 | 8/2013 | Goswami | |
| 2013/0256697 A1* | 10/2013 | Dadgar | H01L 21/02381 257/76 |
| 2013/0294782 A1 | 11/2013 | Liboiron-Ladouceur et al. | |
| 2013/0313567 A1 | 11/2013 | Furuya et al. | |
| 2016/0017515 A1 | 1/2016 | Han | |
| 2016/0027636 A1 | 1/2016 | Han et al. | |
| 2016/0215410 A1 | 7/2016 | Hashimoto et al. | |
| 2017/0033186 A1 | 2/2017 | Han et al. | |
| 2017/0047220 A1 | 2/2017 | Han et al. | |

FOREIGN PATENT DOCUMENTS

| | | |
|---|---|---|
| CN | 103348044 A | 10/2013 |
| WO | WO 01/34877 A1 | 5/2001 |
| WO | WO 2009/015350 A1 | 1/2009 |
| WO | WO 2011/094391 A1 | 8/2011 |
| WO | WO 2015/160903 A1 | 10/2015 |
| WO | WO 2015/160909 A1 | 10/2015 |

OTHER PUBLICATIONS

International Preliminary Report on Patentability for International Application No. PCT/US2015/025899 dated Oct. 27, 2016.
Invitation to Pay Additional Fees for International Application No. PCT/US2015/025907 mailed Jun. 4, 2015.
International Search Report and Written Opinion for International Application No. PCT/US2015/025907 dated Aug. 12, 2015.
International Preliminary Report on Patentability for International Application No. PCT/US2015/025907 dated Oct. 27, 2016.
Invitation to Pay Additional Fees for International Application No. PCT/US2014/029219 mailed Jul. 16, 2014.
International Search Report and Written Opinion for International Application No. PCT/US2014/029219 dated Oct. 14, 2014.
International Preliminary Report on Patentability for International Application No. PCT/US2014/029219 dated Sep. 24, 2015.
International Search Report and Written Opinion for International Application No. PCT/US2013/026743 dated Oct. 25, 2013.
International Preliminary Report on Patentability for International Application No. PCT/US2013/026743 dated May 14, 2015.
Invitation to Pay Additional Fees for International Application No. PCT/US2017/046484 mailed Oct. 19, 2017.
International Search Report and Written Opinion for International Application No. PCT/US2017/046484 dated Dec. 22, 2017.
International Preliminary Report on Patentability for International Application No. PCT/US2017/046484 dated Feb. 21, 2019.
Invitation to Pay Additional Fees for International Application No. PCT/US2018/034308 mailed Jul. 13, 2018.
International Search Report and Written Opinion for International Application No. PCT/US2018/034308 dated Sep. 25, 2018.
[No. Author Listed] OEM Group Foundry Services Introduction. OEM Group. http://www.oemgroupinc.com/foundry.php, 5 pages [last accessed May 9, 2019].

(56) References Cited

OTHER PUBLICATIONS

Abadias, Stress and preferred orientation in nitride-based PVD coatings. Surface and Coatings Technol. Feb. 25, 2008; 202(11): 2223-35.

Aida et al. Chemical mechanical polishing of gallium nitride with colloidal silica. Journal of the Electrochemical Society. Jan. 1, 2011;158(12):H1206-12.

Aida et al. Ultraprecision CMP for sapphire, GaN, and SiC for advanced optoelectronics materials. Curr. Appl. Phys. Sep. 2012;12:S41-6.

Alizadeh et al. Templated wide bandgap nanostructures. J. Appl. Phys. Jun. 2004;95(12):8199-206.

Atwater et al. Orientation filtering by growth velocity competition in zone-melting recrystallization of silicon on $SiO_2$. Appl. Phys. Lett. Dec. 15, 1983;43(12):1126-8.

Bai et al. Structural defects and luminescence features in heteroepitaxial GaN grown on on-axis and misoriented substrates. J. Appl. Phys. Jun. 1, 2005;97(11):116101-1-3.

Baker et al. Characterization of Planar Semipolar Gallium Nitride Films on Sapphire Substrates. J. Appl. Phys. Feb. 2006;45(6):L154-7.

Bernardini et al., Spontaneous polarization and piezoelectric constants of III-V nitrides. Physical Review B. Oct. 15, 1997;56(16):R10024.

Bhuiyan et al. Indium nitride (InN): A review on growth, characterization, and properties. J. Appl. Phys. Sep. 1, 2003;94(5):2779-808.

Brooksby et al. Correlation of spectral luminescence with threading dislocations in green-light-emitting InGaN quantum wells. Appl. Phys. Lett. Jun. 4, 2007;90(23):231901.

Chakraborty et al., Demonstration of nonpolar m-plane InGaN/GaN light-emitting diodes on free-standing m-plane GaN substrates. Japanese Journal of Applied Physics. Jan. 14, 2005;44(1L):L173.

Chen et al. Finite-element analysis on wafer-level CMP contact stress: reinvestigated issues and the effects of selected process parameters. Int. J. Adv. Manuf. Technol. Jun. 1, 2009;42(11-12):1118-30.

Chen et al. Growth and Optical Properties of Highly Uniform and Periodic InGaN Nanostructures. Adv. Mater. Jul. 2, 2007; 19(13): 1707-10.

Chen et al. Single-crystal GaAs and GaSb on insulator on bulk Si substrates based on rapid melt growth. IEEE Electron Dev. Lett. Jun. 2010;31(6):597-9.

Chichibu et al. Origin of defect-insensitive emission probability in In-containing (Al,In,Ga)N alloy semiconductors. Nature Materials. Oct. 2006;5(10):810.

Choi et al., Nearly single-crystalline GaN light-emitting diodes on amorphous glass substrates. Nature Photonics. Dec. 2011;5(12):763.

Chung et al. Seamless on-wafer integration of Si(100) MOSFETs and gaN HEMPTs. IEEE Electron. Dev. Lett. Oct. 2009;30(10):1015-7.

De Mierry et al., Semipolar GaN films on patterned r-plane sapphire obtained by wet chemical etching, Applied Physics Letters. Jun. 7, 2010;96(23):231918.

Eaglesham et al. Growth morphology and the equilibrium shape: The role of "surfactants" in Ge/Si island formation. PRL. Feb. 15, 1993;70(7):966-9.

Enya et al. 531 nm green lasing of InGaN based laser diodes on semi-polar {2021} free-standing GaN substrates. Appl. Phys. Express. Jul. 17, 2009;2(8):082101.

Evans et al., Crystal growth and orientation in deposits condensed from the vapour. Acta Cryst. Nov. 10, 1952;5(6):731-8.

Farrell et al. Materials and growth issues for high-performance nonpolar and semipolar light-emitting devices. Semicond Sci Technol. Jan. 19, 2012;27(2):024001.

Feenstra et al. Recent developments in surface studies of GaN and AlN. Journal of Vacuum Science & Technology B: Microelectronics and Nanometer Structures Processing, Measurement, and Phenomena. May 8, 2005;23(3):1174-80.

Feezell et al. Semipolar (2021) InGaN/GaN Light-Emitting Diodes for High-Efficiency Solid-State Lighing J. Disp. Technol. Apr. 2013;9(4):190-8.

Fitzgerald et al. Relaxed $Ge_xSi_{1-x}$ structures for III-V integration with Si and high mobility two-dimensional electron gases in Si. Journal of Vacuum Science & Technology B: Microelectronics and Nanometer Structures Processing, Measurement, and Phenomena. Jul. 1992;10(4): 1807-19.

Fuhrmann et al. Optimization scheme for the quantum efficiency of GaInN-based green-light-emitting diodes. Appl. Phys. Lett. Feb. 13, 2006;88(7):071105.

Fujito et al., Development of bulk GaN crystals and nonpolar/semipolar substrates by HVPE. MRS bulletin. May 2009;34(5):313-7.

Funato et al. Blue, green, and amber InGaN/GaN light-emitting diodes on semipolar {1122} GaN bulk substrates. J. Appl. Phys. Jun. 30, 2006;45:L659.

Geis et al. Crystallographic orientation of silicon on an amorphous substrate using an artificial surface-relief grating and laser crystallization. Applied Physics Letters. Jul. 1, 1979;35(1):71-4.

Giermann et al. Solid-state dewetting for ordered arrays of crystallographically oriented metal particles. Applied physics letters. Mar. 21, 2005;86(12):121903-1-3.

Givargizov, Mechanisms of oriented crystallization in artificial epitaxy (graphoepitaxy). Thin Solid Films. Aug. 15, 1990;189(2):389-96.

Gomer, Diffusion of adsorbates on metal surfaces. Rep. Prog. Phys. Jul. 1990;53(7):917.

Greene et al. Development of preferred orientation in polycrystalline TiN layers grown by ultrahigh vacuum reactive magnetron sputtering. Appl. Phys. Lett. Nov. 13, 1995;67(20):2928-30.

Gühne et al., Cathodoluminescence spectroscopy of epitaxial-lateral-overgrown nonpolar (11-20) and semipolar (11-22) GaN in relation to microstructural characterization. J. of Appl Phys. Jun. 1, 2007;101(11):113101.

Hashimoto et al. Fabrication of local Ge-on-insulator structures by lateral liquid-phase epitaxy: effect of controlling interface energy between ge and insulators on lateral epitaxial growth. Appl. Phys. Express. May 29, 2009;2(6):066502.

Hashimoto et al., Growth of semipolar {2021} GaN and {2021} GaN for GaN substrate. physica status solidi (b). Jan. 2016;253(1):36-45.

Haskell et al. Defect reduction in (1100) m-plane gallium nitride via lateral epitaxial overgrowth by hydride vapor phase epitaxy. Appl. Phys. Lett. Mar. 14, 2005;86(11):111917.

Haskell et al. Defect reduction in (1120) a-plane gallium nitride via lateral epitaxial overgrowth by hydride vapor-phase epitaxy. Appl. Phys. Lett. Jul. 29, 2003;83(4):644-6.

Honda et al. Growth of (1101) GaN on a 7-degree off-oriented (001)Si substrate by selective MOVPE. J of Crystal Growth. Jul. 2002;242(1-2):82-6.

Honda et al. Growth of GaN free from cracks on a (111)Si substrate by selective metalorganic vapor-phase epitaxy. Appl Phys Lett. Jan. 14, 2002;80(2):222-4.

Ishikawa et al. Thermal stability of GaN on (111) Si substrate. J Cryst Growth. Jun. 15, 1998;189:178-82.

Ito et al. Influence of Thermal Annealing on GaN Buffer Layers and the Property of Subsequent GaN Layers Grown by Metalorganic Chemical Vapor Deposition. Jpn. J. Appl. Phys. Feb. 1999;38(Part 1, No. 2A):649-53.

Jindal et al. Selective area heteroepitaxy of low dimensional a-plane and c-plane InGaN nanostructures using pulsed MOCVD. Phys. Stat. Sol C. May 2008;5(6):1709-11.

Kajikawa et al. Comprehensive perspective on the mechanism of preferred orientation in reactive-sputter-deposited nitrides. J. Vac. Sci. Technol. A. 2003;21(6):1943-54.

Kamimura et al. Dislocation reduction via selective-area growth of InN accompanied by lateral growth by rf-plasma-assisted molecular-beam epitaxy. Appl. Phys. Lett. Oct. 4, 2010;97(14):141913.

Kaneta et al. Nanoscopic recombination processes in InGaN/GaN quantum wells emitting violet, blue and green spectra. Phys. Rev. B. Sep. 16, 2008;78(12):125317.

(56) References Cited

OTHER PUBLICATIONS

Kawaguchi et al. Influence of polarity on carrier transport in semipolar (2021) and (2021) multiple-quantum-well light-emitting diodes. Appl Phys Lett. Jun. 4, 2012;100(23):231110-1-4.
Kawaguchi et al. The formation of crystalline defects and crystal growth mechanism in $In_xGa_{1-x}N$/GaN heterostructure grown by metalorganic vapor phase epitaxy. J. Cryst. Growth. Jun. 15, 1998;189/190:24-8.
Keller et al. Influence of sapphire nitridation on poperties of gallium nitride grown by metalorganic chemical vapor deposition. Appl. Phys. Lett. Mar. 11, 1996;68(11):1525-7.
Kim et al. Compositional analysis of In-rich InGaN layers grown on GaN templates by metalorganic chemical vapor deposition. J. Cryst. Growth. Jun. 1, 2008;310(12):3004-8.
Kim et al. Formation of V-shaped pits in InGaN/GaN multiquantum wells and bulk InGaN films. Appl. Phys. Lett. Sep. 21, 1998;73(12):1634-6.
Kim et al., Improved electroluminescence on nonpolar m-plane InGaN/GaN quantum wells LEDs. Physica status solidi (RRL)—Rapid Research Letters. May 2007;1(3):125-7.
Kioupakis et al. Indirect Auger recombination as a cause of efficiency droop in nitride light-emitting diodes. Appl. Phys. Lett. Apr. 18, 2011;98(16):161107.
Krames et al. Status and future of high-power light-emitting diodes for solid-state lighting. J. Display Technol. Jun. 2007;3(2):160-75.
Kumagai et al. Polarity dependence of AlN {0001} decomposition in flowing $H_2$. J. Cryst. Growth. Jul. 15, 2007;305(2):366-71.
Kung et al. Polycrystalline Si thin-film transistors fabricated at <800 °C: Effects of grain size and {110} fiber texture. J. Appl. Phys. Aug. 15, 1987;62(4):1503-9.
Kuykendall et al. Complete composition tunability of InGaN nanowires using a combinatorial approach. Nature Materials. Dec. 2007;6(12):951.
Langdo et al. High quality Ge on Si by epitaxial necking. Appl. Phys. Lett. Jun. 19, 2000;76(25):3700-2.
Lazarev et al. Three-dimensional reciprocal space mapping of diffuse scattering for the study of stacking faults in semipolar (1122) GaN layers grown from the sidewall of an r-patterned sapphire substrate. J. Appl. Crystallogr. Oct. 2013;46(5):1425-33.
Leonhardt et al. Energetics of Ge nucleation on $SiO_2$ and implications for selective area growth. Surf. Sci. Aug. 15, 2009;603(16):2624-9.
Leung et al. Growth evolution and microstructural characterization of semipolar (1122) GaN selectively grown on etched r-plane sapphire. J. Cryst. Growth. Feb. 2012;341(1):27-33.
Leung et al. Optical emission characteristics of semipolar (1122) GaN light-emitting diodes grown on m-sapphire and stripe-etched r-sapphire. Semicond. Sci. Technol. Jan. 19, 2012;27(2):024016.
Leung et al. Using the kinetic Wulff plot to design and control nonpolar and semipolar GaN heteroepitaxy. Semiconductor Science and Technology. Jan. 19, 2012;27(2):024005.
Leung et al., Semipolar (2021) GaN and InGaN quantum wells on sapphire substrates. Appl. Phys. Lett. Jun. 30, 2014;104(26):262105.
Li et al. Strain influenced indium composition distribution in GaN/InGaN core-shell nanowires. Appl. Phys. Lett. Nov. 1, 2010;97(18):181107.
Liu et al, High-quality single-crystal Ge on insulator by liquid-phase epitaxy on Si substrates. Appl. Phys. Lett. Apr. 2004;84(14):2563-5.
Liu et al. Selective area epitaxy of ultra-high density InGaN quantum dots by diblock copolymer lithography. Nanoscale Res. Lett. Dec. 2011;6(1):342.
Marchand et al. Mechanisms of lateral epitaxial overgrowth of gallium nitride by metalorganic chemical vapor deposition. J. Cryst Growth. Dec. 15, 1998;195(1-4):328-32.
Masui et al., Nonpolar and Semipolar III-Nitride Light-Emitting Diodes: Achievements and Challenges. IEEE Trans Electron Devices. Jan. 2010;57(1):88-100.
Matsuoka et al. N-polarity GaN on sapphire substrate grown by MOVPE. Phys. Status Solidi B. Jun. 2006;243(7):1446-50.

Mccomber et al. Single-Crystal Germanium Growth on Amorphous Silicon. Advanced Functional Materials. Mar. 7, 2012;22(5):1049-57.
Meisch et al. (20-21) MOVPE and HVPE GaN grown on 2" patterned sapphire substrates. Phys Status Solidi C. Apr. 2014;11(3-4):537-40.
Melloch et al., Formation of arsenic precipitates in GaAs buffer layers grown by molecular beam epitaxy at low substrate temperatures. Appl. Phys. Lett. Oct. 8, 1990;57(15):1531-3.
Mileham et al. Wet chemical etching of AlN. Appl. Phys. Lett. Sep. 1995;67(8):1119-21.
Mo et al. Growth and characterization of InGaN blue LED structure on Si(111) by MOCVD. J. Cryst Growth. Dec. 1, 2005;285(3):312-7.
Monemar et al. Growth of thick GaN layers with hydride vapour phase epitaxy. J. Cryst. Growth. Jul. 15, 2005;281(1):17-31.
Moutanabbir et al. Heterogeneous integration of compound semiconductors. Annu. Rev. Mater. Res. Aug. 4, 2010;40:469-500.
Ni et al. Epitaxial lateral overgrowth of (1122) semipolar GaN on (1100) m-plane sapphire by metalorganic chemical vapor deposition. Appl. Phys. Lett. Apr. 30, 2007;90(18):182109.
Ohuchi et al., AlN thin films with controlled crystallographic orientations and their microstructure. J Vac Sci Technol A: Vacuum, Surfaces, and Films. Jul. 1987;5(4):1630-4.
Okada et al. Characterization and growth mechanism of nonpolar and semipolar GaN layers grown on patterned sapphire substrates. Semicond. Sci. Technol. Jan. 19, 2012;27(2):024003.
Okada et al. Direct Growth of m-plane GaN with Epitaxial Lateral Overgrowth from c-plane Sidewall of a-plane Sapphire. Appl. Phys. Express. Oct. 31, 2008;1(11):111101.
Okada et al. Growth Mechanism of Nonpolar and Semipolar GaN Layers from Sapphire Sidewalls on Various Maskless Patterned Sapphire Substrates. Jpn. J. Appl. Phys. Mar. 22, 2011;50(3R):035602.
Okada et al. Growth of Semipolar (1122) GaN Layer by Controlling Anisotrophic Gowth Rates in r-Plane Pattened Sapphire Substrate. Appl. Phys. Express. Aug. 28, 2009;2(9):091001.
Okada et al. High-quality {2021} GaN layers on patterned sapphire substrate with wide-terrace. Appl. Phys. Lett. Dec. 12, 2011;99(24):242103.
Pan et al. High-power, low-efficiency-droop semipolar (2021) single-quantum-well blue light-emitting diodes. Appl. Phys. Express. Jun. 4, 2012;5(6):062103.
Paskov et al. Emission properties of a-plane GaN grown by metal-organic chemical-vapor deposition. J. Appl. Phys. Nov. 1, 2005;98(9):093519.
Paskova et al. GaN Substrates--Progress, Statue, and Prospects. IEEE J. Sel. Top. Quantum. Electron. Jul.-Aug. 2009;15(4):1041-52.
Pearton et al., Fabrication and performance of GaN electronic devices. Mater Sci Eng: R: Rep. Dec. 1, 2000;30(3-6):55-212.
Pereira et al. Compositional pulling effects in $In_xGa_{1-x}N$/GaN layers: a combined depth-resolved cathodoluminescence and Rutherford backscattering/channeling study. Phys. Rev. B. Nov. 2, 2011;64(20):205311.
Pereira et al. Strain and composition distributions in wurtzite InGaN/GaN layers extracted from x-ray reciprocal space mapping. Appl. Phys. Lett. May 27, 2002;80(21):3913-5.
Piprek, Efficiency droop in nitride-based light-emitting diodes. Phys Status Solidi A. Oct. 2010;207(10):2217-25.
Ploch et al. Topography of AlGaN, GaN and InGaN layers grown by metal-organic vapor phase epitaxy. J. Cryst. Growth. Oct. 2012;356(1):70-4.
Preble et al. 2"-4" diameter GaN-on-sapphire substrates free of wafer bow at all temperatures. Phys. Status Solidi C. Apr. 2014;11(3-4):604-7.
Pribat et al., Conformal vapor phase epitaxy. Appl Phys Lett. Dec. 11, 1989;55(24):2544-6. doi: 10.1063/1.101976.
Pribat et al., Defectfree, conformally grown (100)GaAs films. Appl Phys Lett. Jul. 1990;57(4):375-7. doi: 10.1063/1.103696.
Rao et al. Compositional dependence of phase separation in InGaN layers. Appl. Phys. Lett. Sep. 13, 2004;85(11):1961-3.
Romano et al. Structural and optical properties of pseudomorphic $In_x Ga_{1-x} N$ alloys. Appl Phys Lett. Sep. 28, 1998;73(13):1757.

(56) References Cited

OTHER PUBLICATIONS

Romanov et al., Basal plane misfit dislocations and stress relaxation in III-nitride semipolar heteroepitaxy. Journal of Applied Physics. May 15, 2011;109(10):103522.
Romanov et al., Strain-induced polarization in wurtzite III-nitride semipolar layers. Journal of Applied Physics. Jul. 15, 2006;100(2):023522.
Sato et al. Optical properties of yellow light-emitting diodes grown on semipolar (1122) bulk GaN substrates. APL. Jun. 2, 2008;92(22):221110.
Sato et al., High power and high efficiency semipolar InGaN light emitting diodes. Journal of Light & Visual Environment. 2008;32(2):107-10.
Schubert et al., Confined Lateral Selective Epitaxial Growth of Silicon for Device Fabrication. IEEE Electron Device Letters. May 1990;11(5):181-3.
Schubert et al., Solid-state light sources getting smart. Science. May 27, 2005;308(5726):1274-8.
Schwaiger et al. Planar semipolar (1011) GaN on (1123) sapphire. Appl. Phys. Lett. Jul. 7, 2010;96(23):231905.
Sekiguchi et al. Emission color control from blue to red with nanocolumn diameter of InGaN/GaN nanocolumn arrays grown on same substrate. Appl. Phys. Lett. Jun. 7, 2010;96(23):231104.
Shioda et al. Kinetic Analysis of InN Selective Area Metal-Organic Vapor Phase Epitaxy. Appl. Phys. Express. Jul. 11, 2008;1(7):071102.
Shioda et al. Selectivity enhancement by hydrogen addition in selective area metal-organic vapor phase epitaxy of GaN and InGaN. Phys. Stat. Sol A. Jun. 2010;207(6):1375-8.
Shiosaki et al. Low-temperature growth of piezoelectric AlN film by rf reactive planar magnetron sputtering. Appl. Phys. Lett. Apr. 15, 1980;36(8):643-5.
Shivaraman et al. Comparitive analysis of 2021 and 2021 semipolar GaN light emitting diodes using atom probe tomography. Appl. Phys. Lett. Jun. 24, 2013;102(25):251104.
Smith et al., Silicon-on-insulator by graphoepitaxy and zone-melting recrystallization of patterned films. J. Crystal Growth. Oct. 2, 1983:63(3):527-46.
Song et al. Semipolar (2021) GaN and InGaN light emitting diodes grown on sapphire. ACS Applied Materials & Interfaces. Apr. 11, 2017;9(16):14088-92.
Song et al., Nitrogen-Polar (0001) GaN Grown on c-Plane Sapphire with High-Temperature AlN Buffer. Materials. Mar. 2017;10(3):252.
Srivastava et al., Silicon substrate removal of GaN DHFETs for enhanced (>1100 V) breakdown voltage. IEEE Electron Device Letters. Aug. 2010;31(8):851-3.
Srolovitz et al., Simulation of faceted film growth in two-dimensions: microstructure, morphology and texture. Acta Materialia. May 28, 1999;47(7):2269-81.
Sun et al. Improving microstructural quality of semipolar (1122) GaN on m-plane sapphire by a two-step growth process. Appl. Phys. Lett. Dec. 7, 2009;95(23):231904.
Sun et al. Morphological and microstructural evolution in the two-step growth of nonpolar a-plane GaN on r-plane sapphire. J. Appl. Phys. Dec. 15, 2009;106(12):123519.
Sun et al. N-face GaN growth on c-plane sapphire by metalorganic chemical vapor deposition. J. Cryst. Growth. May 1, 2009;311(10):2948-52.
Sun et al. Nitrogen-polar GaN growth evolution on c-plane sapphire. Appl. Phys. Lett. Sep. 29, 2008;93(13):131912.
Sun et al. Understanding and Controlling Heteroepitaxy with the Kinetic Wulff plot: a case study with GaN. Journal of Applied Physics, Sep. 2011;110(5):053517.
Sun et al. Understanding nonpolar GaN growth through kinetic Wulff plots. J. Appl. Phys. Nov. 1, 2008;104(9):093523.
Sundgren, Structure and properties of TiN coatings. Thin solid films. Jun. 14, 1985;128(1-2):21-44.
Takagi et al. High-Power (over 100mW) Green Laser Diodes on Semipolar {2021} GaN Substrates Operating at Wavelengths beyond 530 nm. Appl. Phys. Express. Jul. 12, 2012;5(8):082102.
Tako et al. Single-crystalline (100) Ge networks on insulators by rapid-melting growth along hexagonal mesh-pattern. Appl. Phys. Lett. Jan. 24, 2011;98(4):042101.
Thompson et al., Stress and grain growth in thin films. J. Mech. Phys. Solids. May 1996;44(5):657-73.
Thompson, Structure evolution during processing of polycrystalline films. Ann Rev Mater Sci. Aug. 2000;30(1):159-90.
Thornton, High rate thick film growth. Ann Rev Mater Sci. Aug. 1977;7(1):239-60.
Tsao et al., The Blue LED Nobel Prize: Historical context, current scientific understanding, human benefit. Ann Phys (Berlin). Jun. 2015;527(5-6):A53-61. DOI 10.1002/andp.201570058.
Ueno et al. Growth of semipolar {11-22} GaN using $SiN_x$ intermediate layer by hydride vapor phase epitaxy. Phys. Status Solidi C. Apr. 2014;11(3-4):557-60.
Van Der Drift, Evolutionary selection, a principle governing growth orientation in vapour-deposited layers. Philips Res Repts. 1967;22:267-88.
Van Swygenhoven, Grain boundaries and dislocations. Science. Apr. 5, 2002;296(5565):66-7.
Venables et al. Nucleation and growth of thin films. Rep. Prog. Phys. Apr. 1984;47(4):399.
Vickers et al., Determination of the composition and thickness of semi-polar and non-polar III-nitride films and quantum wells using x-ray scattering. J Appl Phys. Feb. 15, 2012;111(4):043502-1.
Wang et al. Fabrication of GaN nanowire arrays by confined epitaxy. Appl. Phys. Lett. Dec. 4, 2006;89(23):233115.
Warren et al. Arsenic precipitates and the semi-insulating properties of GaAs buffer layers grown by low-temperature molecular beam epitaxy. Appl. Phys. Lett. Sep. 24, 1990;57(13):1331-3.
Watanabe et al., The growth of single crystalline GaN on a Si substrate using AlN as an intermediate layer. J Cryst Growth. Mar. 1, 1993;128(1-4):391-6.
Wernicke et al. Indium incorporation and emission wavelenth of polar, nonpolar and semipolar InGaN quantum wells. Semicond. Sci. Technol. Jan. 19, 2012;27(2):024014.
Wickenden et al., The effect of thermal annealing on GaN nucleation layers deposited on (0001) sapphire by metalorganic chemical vapor deposition. J. Appl. Phys. May 15, 1994;75(10):5367-71.
Wild et al. Chemical vapour deposition and characterization of smooth {100}-faceted diamond films. Diamond and Related Materials. Mar. 31, 1993;2(2-4):158-68.
Wu et al. Temperature dependence of the fundamental band gap of InN. J. Appl. Phys. Oct. 1, 2003;94(7):4457-60.
Xi et al. Microstructure and strain analysis of GaN epitaxial films using in-plane grazing incidence x-ray diffraction. Chin. Phys. B. Jul. 15, 2010;19(7):76804.
Yamamoto et al. High-Efficiency Single-Quantum-Well Green and Yellow-Green Light-Emitting Diodes on Semipolar (2021) GaN Substrates. Appl. Phys. Exp. Dec. 2010;3(12):122102.
Yamane et al. Characterization of structural defects in semipolar {2021} GaN layers grown on {2243} patterned sapphire substrates. J. Appl. Phys. Feb. 14, 2014;53(3):035502.
Yamane et al. Fabrication of freestanding {20-21} GaN substrates by HVPE using $SiO_2$ masked GAN templates. Phys. Status Solidi C. Feb. 20, 2014;11(3-4):401-4.
Yamane et al. Reduction in Dislocation Density of Semipolar GaN Layers on Patterned Sapphire Substrates by Hydride Vapor Phase Epitaxy. Appl. Phys. Express. Sep. 3, 2012;5(9):095503.
Yerina et al. Shape transformation of nanoporous GaN by annealing: From buried cavities to nanomembranes. Applied Physics Letters. Jun. 20, 2011;98(25):251910.
Zhao et al. 30-mW-Class High-Power and High-Efficiency Blue Semipolar (1011) InGaN/GaN Light-Emitting Diodes Obtained by Backside Roughening Technique. Appl. Phys. Exp. Oct. 2010;3(10):102101.
Zhao et al. Green semipolar (2021) InGaN light-emitting diodes with small wavelength shift and narrow spectral linewidth. Appl. Phys. Express. May 24, 2013;6(6):062102.
Zhao et al. High-power blue-violet semipolar (2021) InGaN/GaN light-emitting diodes with low efficiency droop at 200 A/cm2. Appl. Phys. Express. Jul. 15, 2011;4(8):082104.

(56) References Cited

OTHER PUBLICATIONS

Zhao et al. Indium incorporation and emission properties of non-polar and semipolar InGaN quantum wells. Appl. Phys. Lett. May 14, 2012;100(20):201108.
Zhao et al., Green semipolar (2021) InGaN light-emitting diodes with small wavelength shift and narrow spectral linewidth. Applied Physics Express. May 24, 2013;6(6):062102.
Zhong et al. Demonstration of high power blue-green light emitting diode on semipolar (1122) bulk GaN substrate. Electronic Letters. Jul. 2007;43(15):825-6.
Zubia et al. Nanoheteroepitaxy: The Application of nanostructuring and substrate compliance to the heteroepitaxy of mismatched semiconductor materials. J. Appl. Phys. May 1, 1999;85(9):6492-6.
U.S. Appl. No. 14/379,088, filed Aug. 15, 2014, Han.
PCT/US2015/025899, Jul. 7, 2015, International Search Report and Written Opinion.
PCT/US2015/025899, Oct. 27, 2016, International Preliminary Report on Patentability.
PCT/US2015/025907, Aug. 12, 2015, International Search Report and Written Opinion.
PCT/US2015/025907, Oct. 27, 2016, International Preliminary Report on Patentability.
PCT/US2014/029219, Jul. 16, 2014, Invitation to Pay Additional Fees.
PCT/US2014/029219, Oct. 14, 2014, International Search Report and Written Opinion.
PCT/US2014/029219, Sep. 24, 2015, International Preliminary Report on Patentability.
PCT/US2013/026743, Oct. 25, 2013, International Search Report and Written Opinion.
PCT/US2013/026743, May 14, 2015, International Preliminary Report on Patentability.
PCT/US2017/046484, Oct. 19, 2017, Invitation to Pay Additional Fees.
PCT/US2017/046484, Dec. 22, 2017, International Search Report and Written Opinion.
PCT/US2017/046484, Feb. 21, 2019, International Preliminary Report on Patentability.
PCT/US2018/034308, Jul. 13, 2018, Invitation to Pay Additional Fees.
PCT/US2018/034308, Sep. 25, 2018, International Search Report and Written Opinion.
International Preliminary Report on Patentability for International Application No. PCT/US2018/034308 dated Dec. 5, 2019.
Leung et al. Complete orientational access for semipolar GaN devices on sapphire. Phys. Status Solidi B. Jan. 2016;253(1):23-35.
PCT/US2018/034308, Dec. 6, 2019, International Preliminary Report on Patentability.
Leung et al., Evolutionary Selection Growth: Towards Template-Insensitive Preparation of Single-Crystal Layers. Advanced Materials. Mar. 6, 2013;25(9):1285-9.

* cited by examiner

STACKING FAULT-FREE SEMIPOLAR AND NONPOLAR GAN GROWN ON FOREIGN SUBSTRATES BY ELIMINATING THE NITROGEN POLAR FACETS DURING THE GROWTH

RELATED APPLICATIONS

This Application is a national stage filing under 35 U.S.C. 371 of International Patent Application Serial No. PCT/US2017/046484, titled "Stacking Fault-Free Semipolar and Nonpolar GaN Grown on Foreign Substrates by Eliminating the Nitrogen Polar Facets During the Growth," filed on Aug. 11, 2017, which claims the benefit of U.S. Provisional Application Ser. No. 62/374,643, titled "Stacking-Fault-Free Semipolar and Nonpolar GaN Grown on Sapphire by Eliminating the Nitrogen Polar Facets During the Growth," filed on Aug. 12, 2016 and of U.S. provisional Application Ser. No. 62/374,666, titled "A Method to Produce Stacking-Fault-Free Semipolar GaN Grown on Sapphire Substrates," filed on Aug. 12, 2016. The entire disclosures of the foregoing applications are incorporated herein by reference.

BACKGROUND

Technical Field

The technology relates to methods and structures for forming semipolar and nonpolar III-nitride layers and devices on foreign substrates.

Discussion of the Related Art

Gallium nitride (GaN) and other III-nitride materials are widely recognized as desirable materials for fabrication of integrated devices. These materials typically have wider band gaps than silicon-based semiconductors and can be used to make electro-optical devices (e.g., LEDs and diode lasers) that emit radiation in the green and blue regions of the visible spectrum. Also, because of their wide band-gap, III-nitride materials can exhibit higher breakdown voltages when used for fabricating integrated transistors, making these materials attractive for high-power electronics.

Like silicon, III-nitride materials may be grown as high-purity, crystalline material. Unlike silicon, III-nitride materials are typically more difficult and expensive to grow than silicon, so that bulk substrates of III-nitride materials are not currently as commercially feasible as bulk silicon substrates. As a result, methods for epitaxially growing integrated-circuit-grade III-nitride layers on silicon or other crystalline substrates have been studied. Once grown, integrated devices may be fabricated in the III-nitride epitaxial layers using planar microfabrication techniques.

SUMMARY

Methods and structures associated with forming stacking-fault-free semipolar and nonpolar III-nitride layers, such as GaN layers, on patterned foreign substrates (PFS) are described. For example, a sapphire substrate may be patterned with a surface-grating structure to provide exposed c-plane surfaces, and GaN may be grown from these crystal-growth surfaces. A masking process may be carried out prior to growth to prevent nucleation and growth of GaN at other surfaces of the patterned sapphire substrate (PSS). Growth of the GaN may be continued, so that the material coalesces and forms a continuous layer of GaN over the PSS. In some embodiments, regions containing stacking faults may be selectively etched and removed from the layer. A subsequent epitaxial regrowth of GaN that includes an impurity dopant may be performed to fill in the removed portions with essentially stacking-fault-free GaN. In some cases, etch-back is not required and initial crystal growth is with the impurity dopant. The techniques may be applied to various III-nitride compositions.

Some embodiments relate to a method for forming a III-nitride material on a patterned foreign substrate. A method may comprise acts of growing III-nitride crystals from separated crystal growth surfaces located on the patterned foreign substrate; forming regions containing stacking faults in the III-nitride crystals; and etching the III-nitride crystals to remove regions containing stacking faults and reshape the III-nitride crystals. In some aspects, the III-nitride material comprises gallium.

In some cases, etching the regions containing stacking faults and reshaping the III-nitride crystals may comprise etching the III-nitride crystals anisotropically in a liquid KOH etchant. The concentration of the KOH etchant may be between approximately 5% and approximately 50% KOH in water by weight. In some implementations, the etchant may be heated to a temperature between approximately 20° C. and approximately 80° C.

According to some aspects, growing the III-nitride crystals from separated crystal growth surfaces may comprise metal-organic chemical vapor deposition of the III-nitride material on a buffer layer formed on the crystal growth surfaces. A flow rate of $NH_3$ gas during the deposition may be between approximately 0.5 slm and approximately 4 slm. According to some implementations, a flow rate of trimethylgallium or triethylgallium gas during the deposition may be between approximately 10 sccm and approximately 50 sccm. The buffer layer may comprise a low-temperature GaN buffer layer.

In some implementations, a method for forming a III-nitride material on a patterned foreign substrate may further comprise forming the buffer layer.

According to some implementations, etching the regions containing stacking faults may comprise removing (0001) facets containing stacking faults. In some cases, growing the III-nitride crystals from the separated crystal growth surfaces may comprise forming a semipolar GaN facet that is approximately parallel to a process surface of the patterned sapphire substrate. In some aspects, the semipolar GaN facet may be the (2021) facet. In some cases, growing the III-nitride crystals from the separated crystal growth surfaces may comprise forming a nonpolar GaN facet that is approximately parallel to a process surface of the patterned sapphire substrate.

Some implementations of a method for forming a III-nitride material on a patterned foreign substrate may further comprise growing GaN or a III-nitride alloy comprising gallium with an impurity dopant on the reshaped III-nitride crystals. In some cases, the crystal growth surfaces may be separated by regions of the patterned sapphire substrate that are covered with a conformal coating that inhibits epitaxial growth of the III-nitride material.

Some embodiments relate to a method for forming an epitaxial layer of III-nitride material on a patterned foreign substrate. A method may comprise acts of receiving the patterned foreign substrate having separated III-nitride crystals formed thereon; further growing the III-nitride crystals to include an impurity dopant; and eliminating a crystal growth facet on the further grown III-nitride crystals that forms stacking faults. In some cases, further growing the III-nitride crystals comprises growing GaN or an alloy of GaN. The crystal growth facet that is eliminated may be the (0001) facet of GaN.

According to some aspects, the GaN or the alloy of GaN has a semipolar facet orientation approximately parallel to a process surface and wherein the semipolar facet orientation is within 60 degrees of a nonpolar facet.

According to some implementations, further growing the III-nitride crystals may comprise using Ge as the impurity dopant. In some cases, further growing the III-nitride crystals may comprise using Ge as the impurity dopant to dope the GaN or the alloy of GaN with a dopant density between approximately $1 \times 10^{18}$ cm$^{-3}$ and approximately $1 \times 10^{19}$ cm$^{-3}$. According to some aspects, further growing the III-nitride crystals may comprise metal-organic chemical vapor deposition of the GaN or the alloy of GaN on the separated III-nitride crystals. In some implementations, a flow rate of NH$_3$ gas during the deposition is between approximately 0.5 slm and approximately 5 slm. In some cases, a flow rate of trimethylgallium or triethylgallium gas during the deposition is between approximately 10 μmol/min and approximately 200 μmol/min. According to some implementations, a deposition temperature is between approximately 950° C. and approximately 1070° C. A deposition pressure may be between approximately 50 mbar and approximately 400 mbar.

A method for forming an epitaxial layer of III-nitride material on a patterned foreign substrate may further comprise continuing the growth of the III-nitride crystals until the separated III-nitride crystals coalesce into a continuous layer across the patterned sapphire substrate; and further growing III-nitride material on the continuous layer without the impurity dopant. Some implementations may further comprise planarizing the continuous layer to form a process surface on the epitaxial layer.

Some embodiments relate to a substrate comprising a patterned substrate having separated crystal growth facets with masked regions of the substrate's surface between the separated crystal growth facets, and a first region of III-nitride material formed above the patterned substrate containing an impurity dopant that eliminates a crystal growth facet of the III-nitride material that forms stacking faults when the III-nitride material grows over the masked regions. According to some implementations, the impurity dopant may be Ge. In some cases, the masked regions may comprise a conformal oxide coating formed over the patterned substrate.

In some aspects, the III-nitride material may comprise GaN or an alloy of GaN. In some cases, the crystal growth facet that is eliminated is the (0001) facet of the GaN or the alloy of GaN.

According to some implementations, a substrate may further comprise a second region of III-nitride material not containing the impurity dopant formed above the first region. The second region may comprise GaN or an alloy of GaN having a semipolar or nonpolar facet oriented approximately parallel to a process surface of the substrate. In some aspects, the semipolar facet may be within 60 degrees of the nonpolar facet.

Some implementations may further comprise a low-temperature GaN buffer layer formed on the crystal growth surfaces. Some implementations may comprise, alternatively or additionally, a low-temperature AlN buffer layer formed on the crystal growth surfaces.

Some embodiments relate to a method for forming an epitaxial layer of III-nitride material on a patterned substrate. A method may comprise acts of receiving the patterned substrate having crystal growth facets formed thereon and separated by masked regions of the patterned substrate that are covered with a material to prevent formation of III-nitride material on the masked regions; and growing III-nitride crystals on a buffer layer on the patterned substrate with an impurity dopant that eliminates a growth facet of the III-nitride material that forms stacking faults. In some cases, the crystal growth facet that is eliminated is the (0001) facet of GaN.

In some instances, a method may further comprise acts of continuing the growth of the III-nitride crystals until the III-nitride crystals coalesce into a continuous layer across the patterned substrate; further growing the continuous layer without the impurity dopant; and planarizing the continuous layer to form a process surface on the epitaxial layer.

According to some aspects, the III-nitride material may comprise GaN or an alloy of GaN. In some implementations, growing the III-nitride crystals on the buffer layer may comprise using Ge as the impurity dopant. In some cases, growing the III-nitride crystals on the buffer layer may comprise using Ge as the impurity dopant to dope the GaN or the alloy of GaN with a dopant density between approximately $1 \times 10^{18}$ cm$^{-3}$ and approximately $1 \times 10^{19}$ cm$^{-3}$. In some aspects, growing the III-nitride crystals on the buffer layer comprises metal-organic chemical vapor deposition of the GaN or the alloy of GaN. A flow rate of NH$_3$ gas during the deposition may be between approximately 0.5 slm and approximately 5 slm. A flow rate of trimethylgallium or triethylgallium gas during the deposition may be between approximately 10 μmol/min and approximately 200 μmol/min. In some cases, a deposition temperature may be between approximately 950° C. and approximately 1070° C. A deposition pressure may be between approximately 50 mbar and approximately 400 mbar.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabrication, only one device and/or portion of a substrate may be shown to simplify the drawings. In practice, a large plurality of devices or structures may be fabricated in parallel across a large area of a substrate or entire substrate. The drawings are not intended to limit the scope of the present teachings in any way.

Figure 1:
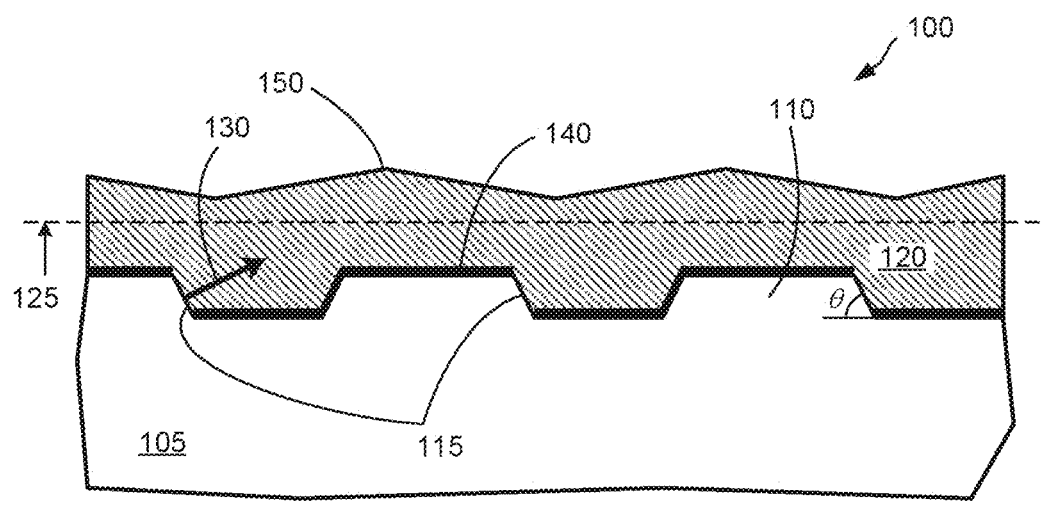
FIG. 1 is an elevation view depicting a portion of a substrate comprising III-nitride material epitaxially grown on a patterned sapphire substrate, according to some embodiments.

When referring to the drawings in the following detailed description, spatial references "top," "bottom," "upper," "lower," "vertical," "horizontal," and the like may be used. For example, "vertical" may be used to refer to a direction normal to the substrate surface, and "horizontal" may be used to refer to a direction parallel to the substrate surface when referring to the drawings. "Upper," "top," or "above" may be used to refer to a vertical direction away from the substrate, whereas "lower," "bottom," or "below" may be used to refer to a vertical direction toward the substrate. Such references are used for teaching purposes, and are not intended as absolute references for embodied devices. An embodied device may be oriented spatially in any suitable manner that may be different from the orientations shown in the drawings.

The features and advantages of the embodiments will become more apparent from the detailed description set forth below when taken in conjunction with the drawings.

DETAILED DESCRIPTION

Because of their wide band-gap values, III-nitride materials, such as GaN, are desirable materials for fabricating green-wavelength or blue-wavelength light-emitting devices and for making high-power or high-voltage transistors. The inventors have recognized and appreciated that some crystal orientations of III-nitride materials may provide improved device performance over other crystal orientations. For example, semipolar gallium nitride materials may be beneficial for high-efficiency light-emitting diodes compared to polar or nonpolar orientations. In polar GaN, a high polarization field within the crystal that is aligned with the direction of current flow in a light-emitting diode, for example, can inhibit carrier recombination and reduce the device's efficiency and contribute to a quantum confined Stark effect. Using a semipolar gallium nitride orientation with nitrogen-polarity (referred to herein as nitrogen-polar semipolar GaN) can improve the efficiency of the light-emitting device reduce unwanted wavelength shifting attributed to the quantum confined Stark effect.

Although the inventors have formed epitaxial layers of semipolar GaN on patterned sapphire substrates, some regions of the formed GaN layers can exhibit a high density of undesirable stacking faults (SFs). High densities of SFs can provide alternate recombination pathways for carriers and adversely affect the performance of semiconductor devices, such as light-emitting diodes (LEDs) and transistors. Therefore, these regions, which typically appear in regular patterns across a substrate should be avoided when fabricating semiconductor devices in the epitaxial layer.

The inventors have conceived of methods and structures for forming epitaxial layers of SF-free GaN or other III-nitride compositions on patterned foreign substrates (PFSs), such as a patterned sapphire substrate or patterned silicon substrate. The methods can be used to form substantially SF-free gallium-nitride materials over large-area substrates (up to 450-mm-diameter substrates or larger), for example. According to some embodiments, regions that initially form with SFs during epitaxy may be selectively etched away from the substrate leaving regions of integrated-circuit-grade III-nitride material spaced apart by voids. A subsequent regrowth may be used to fill the void regions with integrated-circuit-grade semiconductor that is substantially SF-free. In embodiments, SF-free III-nitride material may be grown from a PFS using an impurity dopant.

An example of a substrate 100 that comprises an epitaxial layer 120 of III-nitride material formed over a patterned substrate 105 is depicted in FIG. 1. The patterned substrate 105 may be crystalline (e.g., sapphire, silicon, etc.) and have an array of surface structures 110 (e.g., ribs separated by trenches) patterned across a surface of the substrate. The surface structures 110 and substrate 105 may comprise a plurality of approximately planar surfaces, at least some of which are covered by a masking material 140 that prevents crystal growth from regions of the substrate. Some of the surfaces may be slightly curved, in some embodiments and need not be straight as depicted. The surfaces may be oriented in different directions. For example, surface normal vectors may point in different directions, which may be crystallographic directions in some cases.

To simplify the following explanations, the patterned substrate 105 will be described primarily as a patterned sapphire substrate (PSS). It will be understood that crystalline materials other than sapphire (e.g., silicon, silicon carbide, gallium-arsenide, etc.) may be used for the patterned substrate 105 in other embodiments. The invention is not limited to only patterned sapphire substrates.

According to some embodiments, some of the surfaces of a PSS may not be covered by the masking material 140, and comprise crystal-growth surfaces 115. These exposed surfaces may initiate epitaxial growth of a III-nitride material, whereas the masking material 140 may inhibit growth of the III-nitride material. The crystal-growth surfaces 115 may be approximately parallel (e.g., within 10 mrad) to a (0001) c-plane facet of the sapphire according to some embodiments, having a normal direction [0001] depicted by the arrow 130 in FIG. 1. The crystal-growth surfaces 115 may be vertical) (90°) or inclined at an angle θ between 0° and 90°.

Selecting a cut of the sapphire substrate 105 may determine the orientation or angle of the sapphire's c-plane facet. Selecting an etching process (e.g., tailoring etching conditions) can determine the inclination angle θ of the crystal-growth surfaces 115 on the sapphire substrate 105. In some embodiments, the inclination angle θ is made to be approximately the same as the angle of the sapphire's c-plane facet, which determines an orientation of the subsequently-grown III-nitride material. In this manner, nearly any crystallographic plane of the III-nitride material may be made approximately parallel to or inclined at a desired angle with respect to a finished process surface of the substrate on which integrated circuit devices may be formed. The surface 125 in FIG. 1 is depicted as being parallel to a finished process surface (not shown) and to a process surface of the sapphire substrate 105 into which patterns are formed.

Figure 2A:
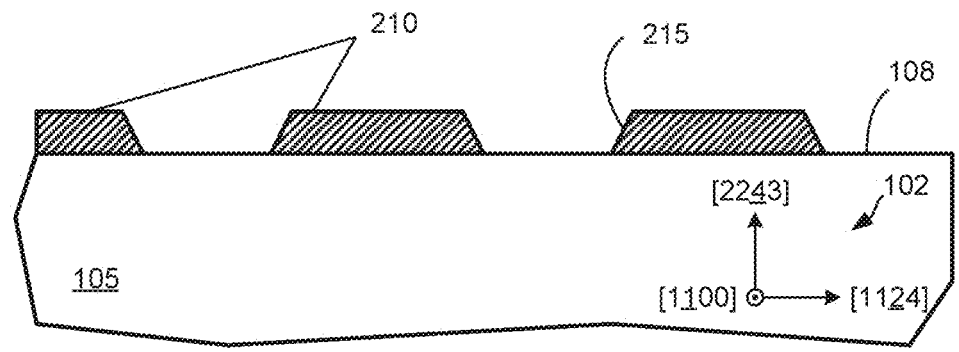
FIG. 2A and FIG. 2B depict structures associated with a process for patterning a sapphire substrate, according to some embodiments.
Figure 2B:
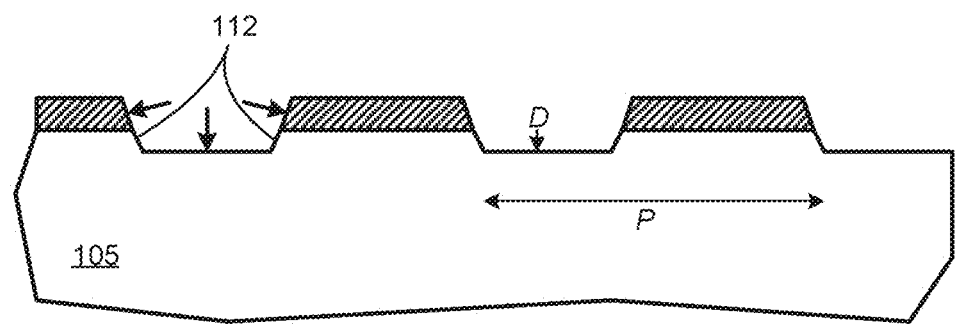

FIGS. 2A-2B depict structures associated with a method for forming a patterned sapphire substrate, according to some embodiments. For this example, an initially unetched sapphire substrate 105 may be cut so that its (2243) plane is approximately parallel to a top surface 108 of the substrate. Other embodiments may have a sapphire substrate 105 cut with a different crystallographic orientation. A resist 210 may be deposited and patterned on the surface of the sapphire substrate 105. The resist may be patterned as a periodic grating, according to some embodiments, so that bars of resist 210 extend along the surface of the substrate (into the page as depicted in FIG. 2A). The resist pattern may be aligned to a crystallographic orientation of the sapphire substrate, so that the bars of resist 210 run in a direction that is approximately normal (e.g., within 10 mrad) to the (1100) plane of the sapphire substrate 105. The resist 210 may be a soft resist (e.g., a polymeric resist) according to some embodiments, or may be a hard resist (e.g., a patterned inorganic material) in some implementations. In some cases, the resist may be patterned to have sloping side walls 215, as depicted in the drawing.

A dry etching process (e.g., a reactive ion etching (RIE) process) may be used to etch the sapphire substrate 105, as depicted in FIG. 2B. The etching process may be anisotropic or semi-anisotropic. According to some embodiments, the etching process may be semi-selective, in that it etches some of the resist 210, while primarily etching the substrate 105. In a semi-selective etch, as the etching of the sapphire substrate 105 proceeds, the resist 210 may etch back in addition to trenches being etched into the substrate. In some embodiments, a chlorine-based etchant may be used for etching the sapphire. Example etch gases for sapphire may include $BCl_3$, $Cl_2$, and Ar or some combination thereof. An etch pressure may be between 10 mTorr and 100 mTorr. In some implementations, a small amount of an etchant for the resist (e.g., $O_2$ for a polymeric resist) may be included as an etchant gas to etch back some of the resist 210.

Other etchants or etching processes may be used in other embodiments depending on the material used for the resist and/or on the substrate material. In some implementations, an etchant for the sapphire substrate may partially etch a resist 210. For example and when silicon (Si) is used as the substrate, a strong base solution (such as KOH) may be used to anisotropically wet-etch the Si and expose (111) facets from which GaN may be grown. The (111) facets may be exposed in grooves that are produced by the wet etching. The (111) facets may be oriented at any angle between 0° and 90° with respect to a planar surface of the Si substrate.

The result of partially etching back the resist while the trenches are being etched may create sloped sidewalls 112 inclined at an angle θ along the trenches in the sapphire substrate 105, as depicted in FIG. 2B. Instead of the sidewalls being orientated 90° with respect to the unetched surface of the sapphire substrate 105, the sidewalls may be oriented between 0° and 90°, or between approximately these values, according to some embodiments. In some cases, the sidewalls may be oriented between 60° and 80°, or between approximately these values. In some cases, the sidewalls may be oriented between 65° and 75°, or between approximately these values. The slope of the etched sapphire sidewalls 112 may be controlled by adjusting the etch rate of the resist 210 (e.g., adjusting a concentration of etchant for the resist) and/or adjusting the slope of the sidewalls 215 of the resist 210 (e.g., adjusting exposure and development conditions for patterning the resist) and/or adjusting etch parameters for the sapphire etch.

According to some embodiments, a spacing or pitch P of the trenches etched into the sapphire may be between 0.25 micrometers (μm) and 10 μm, or between approximately these values. In some embodiments, the spacing between trenches may not be periodic. According to some embodiments, an etch depth D of the trenches may be between 50 nanometers (nm) and 2 μm, or between approximately these values. The width of the trenches may be approximately equal to, or equal to, one-half the pitch P, in some embodiments. In other embodiments, the width of the trenches may be greater than, or less than, one-half the pitch P. After etching the trenches, any remaining resist may be removed from the substrate 105 using a dry etch, a solvent, or a substrate cleaning process that dissolves the resist 210.

After removing the resist, a masking layer 140 may be formed over some of the patterned surfaces on the sapphire substrate. The inventors have found that a masking layer 140 comprising an evaporated oxide (e.g., silicon oxide deposited by an electron-beam evaporation process) is insufficient at masking surfaces of the patterned sapphire substrate 105 from which III-nitride growth is not desired. Irreproducible crystal-growth results encountered under subsequent high-temperature (HT) III-nitride growth conditions were believed to be attributed to a less-than unity sticking coefficient, surface diffusion, and re-evaporation of the e-beam evaporated silicon oxide. To overcome problems associated with the evaporated oxide masking layer, the inventors have developed a process for forming a high-temperature conformal coating to mask selected surfaces of the sapphire substrate.

Figure 2C:
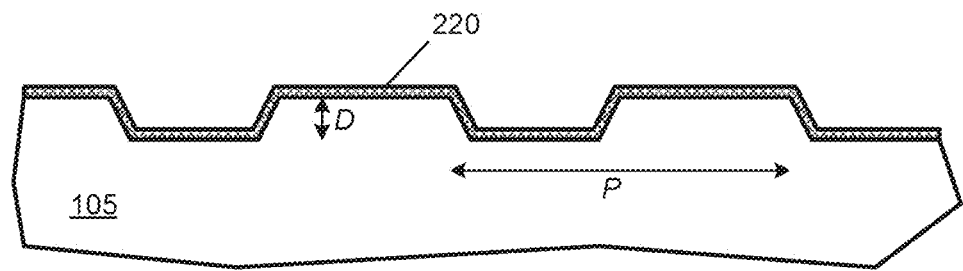
FIG. 2C, FIG. 2D, FIG. 2E, and FIG. 2F depict structures associated with a process for masking selected surfaces of a patterned sapphire substrate, according to some embodiments.

According to some embodiments, a high-temperature conformal coating 220 may be formed over the surface of the patterned sapphire substrate 105, as depicted in FIG. 2C. The HT conformal coating may comprise an oxide (e.g., a silicon oxide) or a nitride (e.g., a silicon nitride) that may be formed by an HT conformal deposition process, according to some embodiments. The temperature during deposition may be between 600° C. and 1000° C., or between approximately those temperatures. For example, an oxide may be deposited by a (CVD) process, such as plasma-enhanced chemical vapor deposition (PECVD). In some implementations, an oxide or nitride coating 220 may be deposited by an atomic layer deposition (ALD) process. The thickness of the conformal coating may be between 10 nm and 50 nm, or between approximately these values, according to some embodiments, and may cover all patterned surfaces of the substrate 105, as depicted in the drawing. A conformal coating may have a uniform thickness, irrespective of the substrate surface's orientation, unlike a coating produced by e-beam evaporation, for example.

Figure 2D:
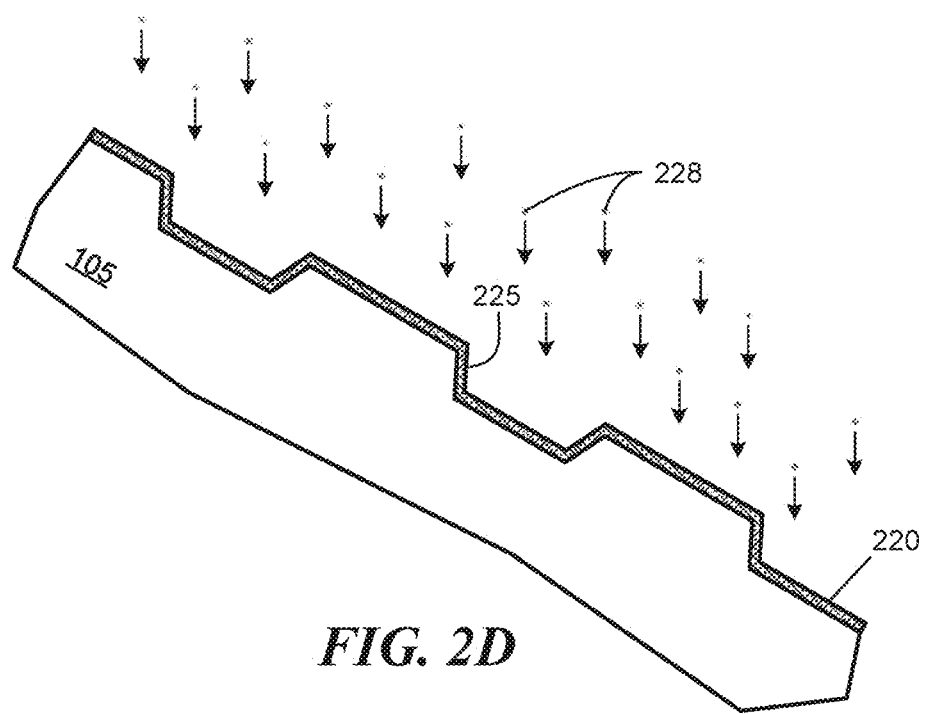
Figure 2E:
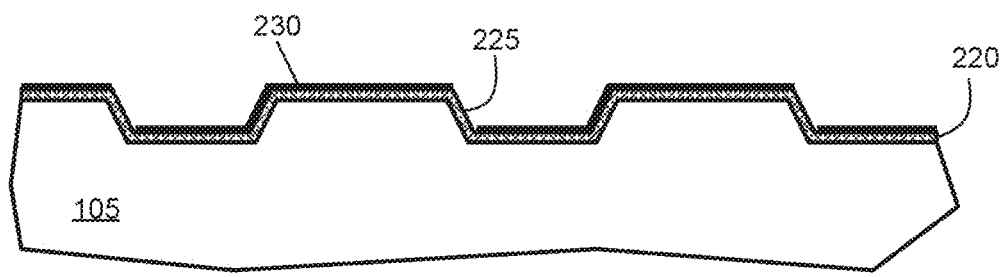

According to some embodiments, a shadow evaporation may be performed subsequently to form a resist 230 over a portion of the oxide coating 220, as depicted in FIGS. 2D-2E. For example, the substrate 105 may be inclined at an angle with respect to a target in an electron-beam evaporation system. During the evaporation, evaporants 228 may be incident on exposed surfaces of the oxide coating 220. Some "shadowed surfaces" 225 of the coating may be hidden or screened from the incident evaporants 228 by an overlying surface. These shadowed surfaces 225 may not be coated by the evaporants 228. In some embodiments the evaporants comprise metal (e.g., any one or combination of Cr, Ni, Al, Ti, Au, Ag), though other materials may be used in some embodiments.

In some embodiments, photolithography may be used to form a resist over selected surfaces of the conformal coating 220. However, photolithography would require several process steps (e.g., resist deposition, exposure, and developing), and require an alignment of a photomask to the substrate features.

Figure 2F:
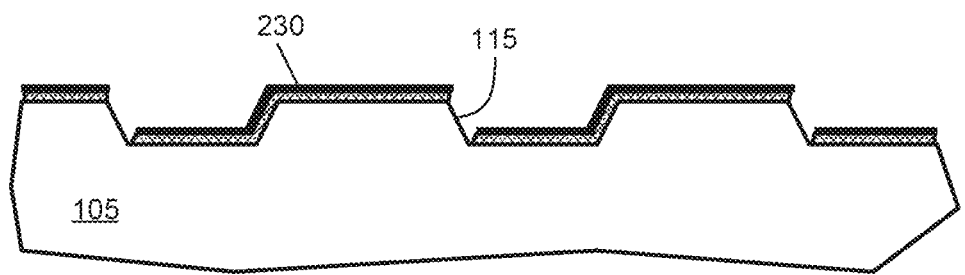

A shadow evaporation may be used to form a hard resist 230 over selected surfaces of the oxide 220 in one step without the need for alignment of a mask to the substrate, resulting in a structure as depicted in FIG. 2E. The shadowed surfaces 225, screened from the evaporant, may have an exposed oxide layer 220 covering the c-plane surfaces of the patterned sapphire substrate, but not include an overlayer of metal or other protective resist 230. A selective anisotropic dry etch may then be performed to remove the oxide coating 220 from the shadowed surfaces 225 and expose the underlying sapphire. The dry etch may comprise a fluorine-based etchant for etching an oxide coating 220, according to some embodiments. The etching may expose the underlying crystal-growth surfaces 115 of the patterned sapphire substrate, as depicted in FIG. 2F. In some embodiments, a wet etch (e.g., a buffered oxide etch) may be used to remove an oxide coating 220 from the shadowed surfaces 225. In some implementations, a wet or dry etch may not be selective, and may be a timed etch. An etch that removes the coating 220 may, in some cases, partially etch the sapphire after removing the coating.

According to some embodiments, the resist 230 may be removed with a dry or wet etch process or a substrate-cleaning process. For example, a hard coating of metal (e.g., Cr) may be removed with a suitable metal etchant. In some implementations, the substrate may be cleaned in preparation for epitaxial growth of III-nitride material. For example, the substrate may be cleaned in acetone, methanol, and a piranha solution before loading into a metal-organic chemical vapor deposition reactor for subsequent crystal growth.

The inventors have discovered and appreciated that careful preparation and formation of a buffer layer at the exposed crystal-growth surfaces 115 of the patterned sapphire substrate 105 is needed to form semipolar III-nitride material of integrated-circuit-grade quality and of a desired polarity. Several buffer layer processes including low-temperature (LT) aluminum nitride (AlN), high-temperature AlN, and low-temperature GaN buffer layer processes were tested and refined to obtain a buffer layer process that provides suitable growth of semipolar GaN of a desired polarity from the patterned sapphire substrate. According to a first buffer-layer process, gallium-polar semipolar GaN may be grown reliably from a patterned sapphire substrate 105. According to a second buffer-layer process, nitrogen-polar semipolar GaN may be grown reliably from a patterned sapphire substrate 105.

According to some embodiments, a first buffer layer process may be used to form gallium-polar semipolar GaN, for example, from the crystal growth surfaces 115. In a first buffer-layer process, a PSS 105 may be subjected to a cleaning process followed by an LT GaN buffer layer growth process, which may be carried out in the same growth reactor. The cleaning process may comprise heating the substrate to between 1000° C. and 1200° C., or between approximately these values, in a hydrogen ($H_2$) ambient. In some cases, the buffer layer may be formed under GaN epitaxial growth conditions at temperatures between 400° C. and 650° C., or between approximately these values. According to some embodiments, the LT GaN buffer layer is formed at a temperature of approximately 500° C. In some cases, the chamber pressure may be maintained between 50 mbar and 400 mbar, or between approximately these values. A flow rate of $NH_3$ may be between 1 slm and 4 slm, or between approximately these values, and a flow rate of trimethylgallium (TMGa) may be between 5 sccm and 50 sccm, or between approximately these values. The buffer layer may be grown to a thickness between 10 nm and 50 nm, or between approximately these values, according to some embodiments.

The inventors have found that an LT GaN buffer layer heated to above 900° C. may diffuse more readily than an LT AlN layer. In some embodiments, an LT GaN buffer layer may migrate and redistribute from other oxide-covered surfaces of the PSS 105 to the exposed c-plane crystal-growth surfaces 115. This redistribution can promote selective growth of GaN at the crystal-growth surfaces. In some implementations, an LT AlN buffer layer may be used prior to forming gallium-polar semipolar GaN. For example, the first buffer layer process above may be used with trimethylaluminum (TMAl) substituted for TMGa.

After growth of an LT buffer layer according to the first buffer layer process, the temperature of the substrate may be ramped up for HT growth of gallium-polar semipolar GaN from the crystal-growth surfaces. According to some embodiments, the LT GaN buffer layer may be annealed for a period of time at a temperature between 850° C. and 1150° C., or between approximately these values, prior to introducing reactants for GaN growth. The annealing period may be between 1 minute and 10 minutes, or between approximately these values. HT growth of gallium-polar semipolar GaN, for example, may occur at temperatures between 900° C. and 1150° C., or between approximately these values according to some implementations.

According to other embodiments, a second buffer layer process may be used to form nitrogen-polar semipolar GaN, for example, from the crystal growth surfaces 115. In a second buffer layer process, the PSS 105 may be thermally cleaned as described for the first buffer layer process. A nitridation process may then be performed to nitridate exposed crystal-growth surfaces 115. According to some embodiments, the nitridation process may comprise heating the PSS 105 to a temperature between 850° C. and 1050° C., or between approximately these values, in an ambient comprising a mixture of nitrogen ($N_2$) and ammonia ($NH_3$) gases. The $N_2$ flow rate may be between 2 slm and 8 slm, or between approximately these values. The $NH_3$ flow rate may be between 1 slm and 6 slm, or between approximately these values. The duration of nitridation may be between 0.5 minute and 5 minutes, or between approximately these values. Because of the nitridation, growth from the c-plane sapphire at the crystal-growth surfaces 115 would be least favorable compared to other surfaces of the patterned sapphire substrate 105. Therefore, the masking layer 140 (e.g., conformal oxide coating 220) is needed to prevent unwanted crystal growth at the other sapphire surfaces.

Following nitridation, the PSS may be subjected to an LT GaN buffer layer process during which the substrate is heated to between 400° C. and 650° C., or between approximately these values in some implementations. In some cases, the substrate may be heated to approximately 500° C., and the chamber pressure may be maintained between 100 mbar and 300 mbar, or between approximately these values. A flow rate of $NH_3$ may be between 0.5 slm and 5 slm, or between approximately these values. The flow rate of trimethylgallium (TMGa) may be between 5 sccm and 50 sccm, or between approximately these values. The LT GaN buffer layer may be grown to a thickness between 20 nm and 100 nm, or between approximately these values. In some embodiments, the buffer layer may be grown to a thickness greater than 50 nm and less than 100 nm. Improved growth conditions for nitrogen-polar semipolar GaN are found when the LT GaN buffer layer is formed under the following conditions: the chamber pressure is approximately 200 mbar, the $NH_3$ flow rate is approximately 1 slm, the TMGa flow rate is approximately 40 sccm, and the buffer layer is grown to a thickness of approximately 80 nm.

After growth of an LT GaN buffer layer according to the second buffer layer process, the temperature of the substrate may be ramped up for HT growth of nitrogen-polar semipolar GaN from the crystal-growth surfaces. In some implementations, the LT GaN buffer layer may be annealed prior to HT growth of nitrogen-polar semipolar GaN material. The inventors have found improved results for subsequent growth of the nitrogen-polar semipolar GaN when the anneal time for the LT GaN buffer layer is reduced compared to that used for growing gallium-polar semipolar GaN by up to a factor of three. During the anneal, the $H_2$ flow rate may be between 2 slm and 8 slm, or between approximately these values. The $NH_3$ flow rate may be between 0.5 slm and 6 slm, or between approximately these values. The duration of annealing may be between 0.5 minute and 3 minutes, or between approximately these values. The anneal temperature may be between 850° C. and 1150° C., or between approximately these values.

A difficulty of growing nitrogen-polar semipolar GaN from an LT GaN buffer, as compared to growing gallium-polar semipolar GaN, is attributed to different transformations that occur during annealing of the buffer layers based on the polarities of the buffers, and the selectivity processes that occur on patterned sapphire substrates. For example, a Ga-polar GaN LT-GaN buffer layer may undergo a ripening recrystallization phase during annealing (which can be indicated by a nose-like peak in in-situ reflectance traces). During the recrystallization phase, decomposition and redeposition of the GaN may occur, which can favor the growth of Wurtzite phase nuclei on the substrate.

In contrast, and as can be seen by reflectance measurements, an N-polar GaN buffer layer may not undergo such a transformation, so that HT-GaN growth may proceed without a roughening-recovery phase with instant oscillations. For N-polar GaN, inspection of a buffer layer and initial growth stages by scanning-electron microscopy (SEM) and atomic-force microscopy (AFM) show an enhanced decomposition of the buffer layer. A rate-limiting process of GaN decomposition may be attributed to the formation of GaH at the substrate surface. The difference in decomposition rate between gallium and nitrogen polarities may be attributed to the bond configurations in the crystal structure, where in each bilayer the metal ion has only one back bond to nitrogen atoms (case of nitrogen-polarity) instead of three bonds (gallium-polarity). For a Ga-polar GaN buffer layer, an enabling factor for uniform crystal growth is redistribution of the LT-GaN buffer layer onto the c-sapphire crystal-growth surfaces during annealing. Since redistribution does not occur readily with a nitridized sapphire surface and N-polar LT-GaN buffer layer, sparse nucleation can result, and has been observed by the inventors. To improve subsequent crystal-growth uniformity for the N-polar case, the buffer layer thickness may be increased and the buffer layer anneal time may be reduced.

According to some embodiments, a buffer layer may be formed from a material different than a subsequently-grown material. For example, a buffer layer may be formed from any suitable III-nitride alloy (e.g., AlN, InN, AlGaN, InGaN, InAlGaN), whereas a subsequently-grown epitaxial layer may comprise GaN or other III-nitride material. In some implementations, a buffer layer may be formed from GaN, and a subsequently-grown semipolar epitaxial layer may comprise any other suitable III-nitride alloy. The formation of other semipolar materials may require the addition or substitution of other reactants, such as trimethylaluminum (TMA) or triethylaluminum (TEA) as sources of aluminum and trimethylindium (TMI) or triethylindium (TEI) as sources of indium. Reactants used for forming GaN epilayers may include triethylgallium (TEGa) or trimethylgallium (TMGa). The flow rates for these gases may be between 5 sccm and 65 sccm during growth or regrowth of a semipolar III-nitride epilayer.

Figure 2G:
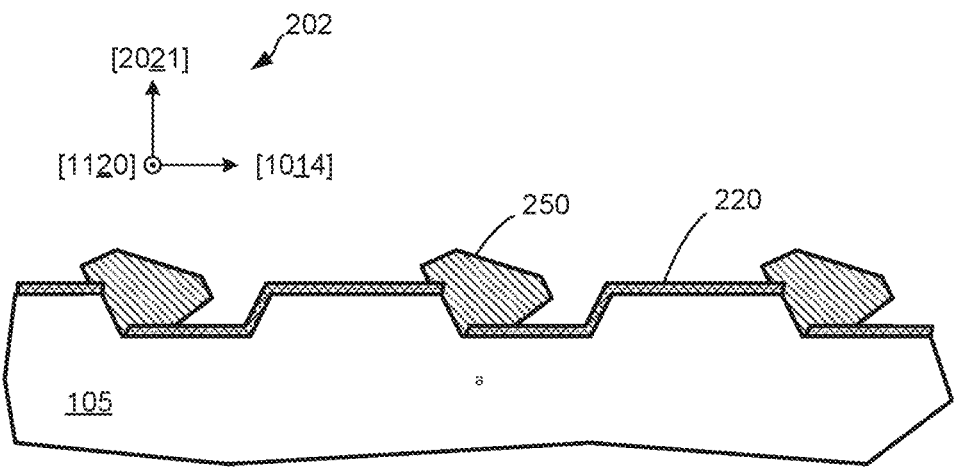
FIG. 2G depicts formation of semipolar GaN on a patterned sapphire substrate, according to some embodiments.

After forming a buffer layer, epitaxial growth of a semipolar III-nitride material may be carried out. As growth of semipolar III-nitride material (e.g., gallium-polar semipolar GaN) proceeds from the crystal growth surfaces 115, islands of III-nitride crystals 250 may first form across the surface of the patterned sapphire substrate 105, as depicted in FIG. 2G. Because of the inclined crystal growth surfaces 115 on the patterned sapphire substrate 105, the III-nitride crystals 250 may grow with a selected crystallographic plane (e.g., (2021) for gallium-polar semipolar GaN or (2021) for nitrogen-polar semipolar GaN) in a direction that is parallel to the original planar surface of the sapphire substrate 105. Crystallographic directions for nitrogen-polar semipolar GaN crystals 250 are depicted by the axes 202 in FIG. 2G.

The epitaxial growth process for a III-nitride material, after formation of the buffer layer, may comprise metal-organic chemical-vapor deposition (MOCVD), according to some embodiments. In some embodiments molecular-beam epitaxy (MBE) or vapor phase epitaxy (VPE) processes may be used. For thin layers, atomic layer deposition may be used. For an exemplary MOCVD process, the growth conditions may comprise a growth temperature between 980° C. and 1070° C., or between approximately those temperatures, and a chamber pressure between 50 mbar and 300 mbar, or between approximately those pressures. The flow rate of $NH_3$ gas may be between 0.5 slm and 4 slm, or between approximately those flow rates. The flow rate of trimethylgallium or triethylgallium may be between 10 sccm and 50 sccm, or between approximately those flow rates.

Figure 2H:
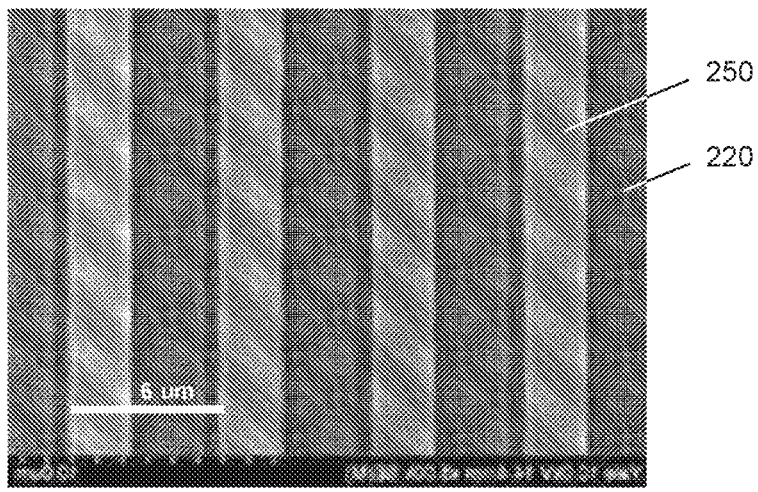
FIG. 2H is a scanning-electron micrograph showing, in plan view, gallium-polar semipolar GaN stripes formed on a portion of a patterned sapphire substrate, according to some embodiments.

FIG. 2H is a scanning electron micrograph that shows, in plan view, gallium-polar semipolar GaN crystals 250 grown from a masked and patterned sapphire substrate 105, according to some embodiments. The PSS comprises crystal-growth surfaces 115 spaced approximately 6 μm apart, and the etch depth D of trenches in the sapphire substrate is approximately 1 μm. The crystal-growth surfaces are oriented at approximately θ=75° from the process surface of the substrate. Other surfaces on the PSS substrate were masked with a PECVD oxide, as described above in connection with FIGS. 2C-2F. A LT GaN buffer layer approximately 20 nm thick was formed, without nitridation, on the crystal growth surfaces 115 of the substrate. In other embodiments, an LT AlN buffer may be used. The growth conditions for the GaN buffer layer were: pressure of approximately 200 mbar, temperature of approximately 500° C., an $NH_3$ flow of approximately 1 slm, and a TMGa flow rate of approximately 40 sccm. For a LT AlN buffer layer, a TMAl flow rate of approximately 25 sccm may be used. Subsequently, gallium-polar semipolar GaN was grown under the following epitaxial growth conditions: approximately 1030° C., approximately 100 mbar, approximately 40 sccm TMGa, and approximately 1 slm $NH_3$. The micrograph in FIG. 2H shows that bars of GaN crystal 250 may be grown from the crystal-growth surfaces 115 with high spatial uniformity.

Figure 3:
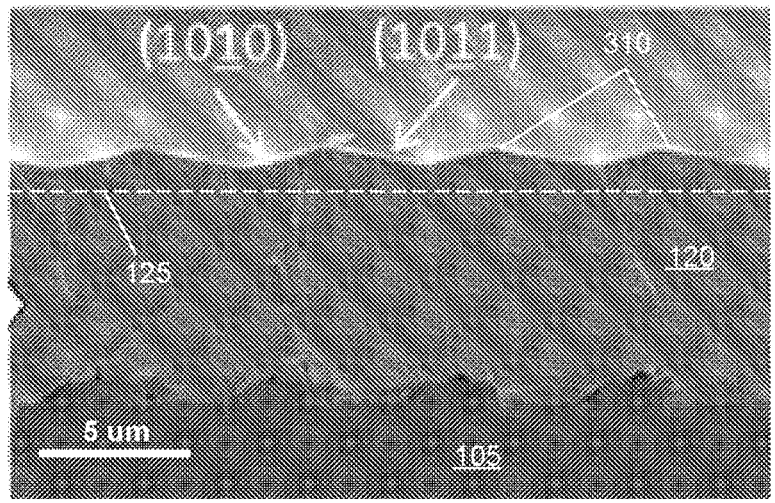
FIG. 3 is a scanning-electron micrograph showing a cross-section view of coalesced semipolar GaN formed on a patterned sapphire substrate, according to some embodiments.

Epitaxial growth may be continued so that the III-nitride crystals 250 coalesce to form a continuous epitaxial semiconductor layer 120 over the PSS 105, referring again to FIG. 1. A scanning electron microscope (SEM) image of a coalesced, semipolar GaN epitaxial layer 120 formed on a PSS is shown in FIG. 3. A thickness of the GaN layer is approximately 8 microns. A thickness of the coalesced epitaxial layer may be between 100 nm and 20 microns, according to some embodiments, though thicker layers may be grown in some cases.

In some implementations and dependent upon the III-nitride orientation, an upper surface of the epitaxial layer 120 may have ridges 310 running parallel to the crystal growth surfaces 115, which result from intersections of crystallographic growth planes (e.g., the (1010) and (1011) planes for gallium-polar semipolar GaN). When the substrate is subsequently planarized (e.g., by chemical-mechanical polishing or grinding and polishing), the resulting process surface may be approximately parallel to or oriented at a desired angle with respect to a different crystal plane. For the example shown in FIG. 3, a final process surface 125 on the GaN epitaxial layer may be approximately parallel to a (2021) facet of the GaN semiconductor.

Figure 4A:
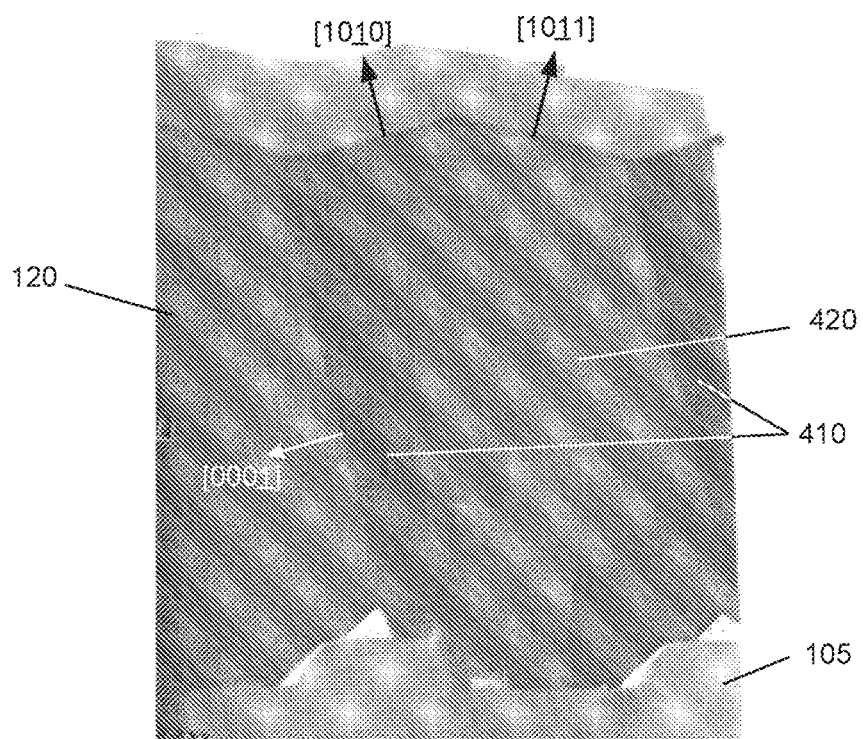
FIG. 4A is a transmission-electron micrograph showing stacking faults in a coalesced epitaxial layer of GaN on a patterned sapphire substrate, according to some embodiments.

The inventors have found that stacking faults can occur in regions of a coalesced, III-nitride epitaxial layer 120 formed on a PSS. Although the SFs may not be apparent when viewing the epitaxial layer under an optical microscope or SEM (see FIG. 3, for example), the SFs may be observed in two ways. A first way is to examine thin cross sections of the epitaxial layer using a transmission electron microscope (TEM). An image obtained with a TEM for a semipolar GaN epitaxial layer is shown in FIG. 4A. There may be regions 410 that include basal plane stacking faults which appear as linear dark bands in the micrograph. The SFs are a type of crystal defect that can adversely affect semiconductor devices.

Figure 4B:
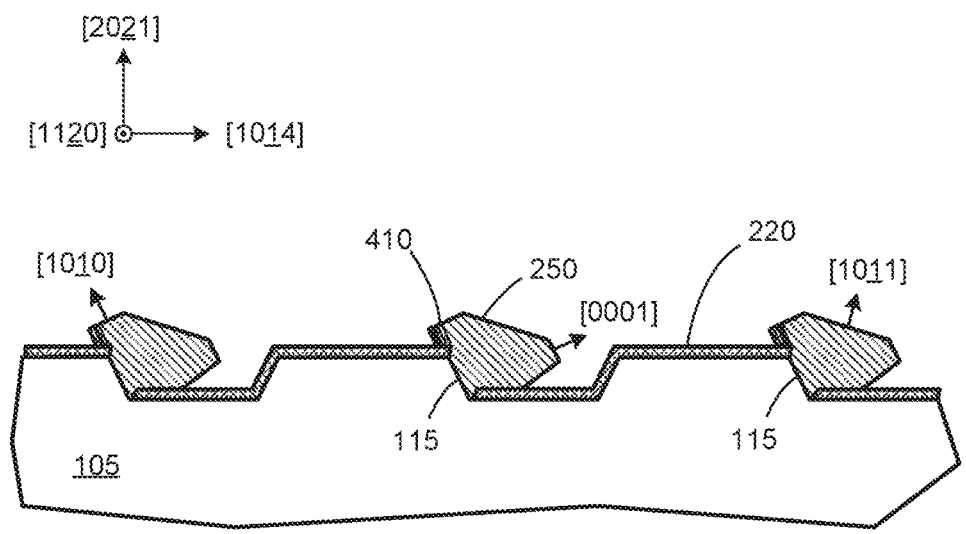
FIG. 4B depicts formation of semipolar GaN crystals on growth surfaces of a patterned sapphire substrate, according to some embodiments.

The SFs may occur as the GaN crystal grows in the [0001] direction along a heterogeneous interface, as depicted in FIG. 4B. Stacking-fault regions 410 may form as the islands of III-nitride crystals 250 grow from the crystal growth surfaces 115 on the PSS over masked regions of the substrate 105 in the [0001] direction. The SF regions 410 may be separated by larger uniform regions 420 where the crystal forms in other directions and is essentially free from SFs, although some defects may be present in these uniform regions at considerably lower density.

Figure 5:
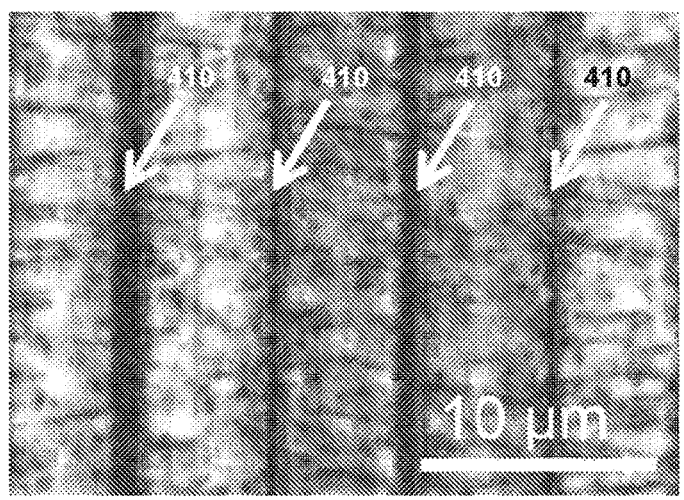
FIG. 5 shows a cathodoluminescence image recorded from a coalesced epitaxial layer of semipolar GaN formed on a patterned sapphire substrate, according to some embodiments.

The stacking faults may also be observed using cathodoluminescence (CL) measurements of an area of the epitaxial layer. In a CL measurement, energetic electrons impinge on the epitaxial layer and cause the layer to luminesce. Regions that contain defects may not luminesce and appear dark when viewed microscopically. FIG. 5 shows a CL image (plan view of the epitaxial layer 120) obtained for a gallium-polar semipolar GaN epitaxial layer 120 formed on a PSS 105. The stacking fault regions 410 appear as dark bands running across the surface of the substrate. The spacing of the dark bands is approximately equal to the spacing of the crystal growth surfaces 115 on the PSS.

According to some embodiments, the regions containing stacking faults may be minimized or eliminated through one or more processing techniques. One approach may comprise terminating the growth of the epitaxial layer 120 after regions of SFs have formed and selectively etching away the stacking-fault regions 410. A subsequent selective-growth process may then be used to regrow III-nitride material to fill the voids formed by the removal of the stacking-fault regions 410. The selective-growth process may be a process in which the growth rate of the undesirable facet (e.g., the (0001) facet in the example of FIG. 4A and FIG. 4B) is accelerated over the growth rate of other crystal growth facets (e.g., the (1010) and (1011) directions in this example). According to the Wulff principal, the crystal facets with the highest growth rate will terminate more quickly than facets with lower growth rates, and the crystal shape will be dominated by the facets with the lower growth rates. Elimination of the (0001) growth facet can remove it as a source of SF formation.

FIG. 6A-6E show structures associated with processing steps that may be used to minimize or eliminate stacking fault regions in epitaxial layers of III-nitride material formed over a PFS. Although the example shown continues with a same semipolar orientation of GaN described above, the embodiments are not limited to only the depicted semipolar orientation. The processing steps may be applied to other orientations of GaN including nonpolar orientations and may be applied to other III-nitride materials. Other orientations of GaN include, but are not limited to (1122), (1120), (1011), (1010), and (3031) orientations. The inventors have recognized and appreciated that facet orientations within 60 degrees of a nonpolar facet orientation, or approximately within this value, may be desirable for semiconductor device applications such as LEDs, lasers, and transistors. Beyond 60 degrees, polarization fields and/or misfit dislocations within the epitaxially formed III-nitride material can adversely affect device performance.

Figure 6A:
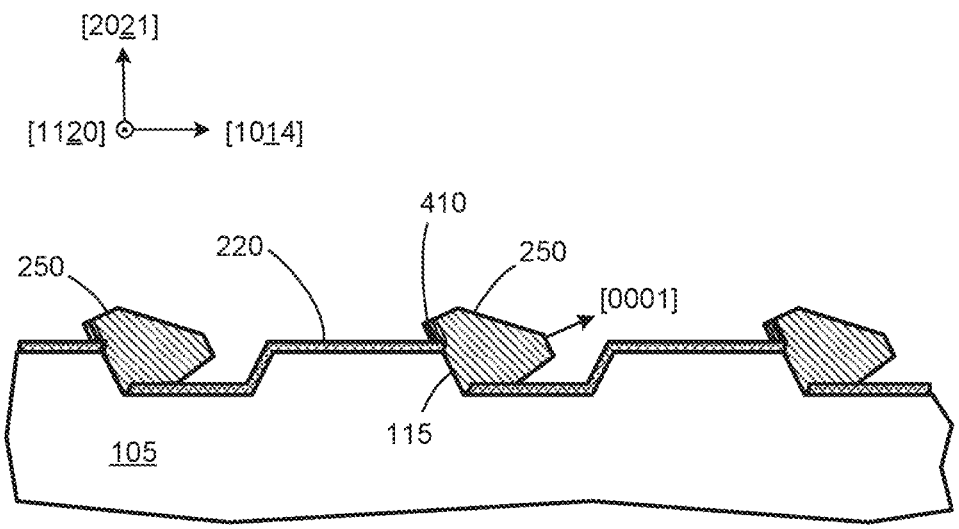
FIG. 6A and FIG. 6B illustrate growth of semipolar GaN crystals from growth surfaces of a patterned sapphire substrate, according to some embodiments.

According to some embodiments, a patterned sapphire substrate 105 having crystal-growth surfaces 115 and a coating 220 that masks other surfaces of the PSS substrate 105 may be provided as a substrate for forming III-nitride material thereon. The crystal-growth surfaces may be approximately parallel to the c-plane facet (0001) of the sapphire substrate and may be vertical or inclined from vertical at a desired angle. In the example shown, gallium-polar semipolar GaN with a process surface parallel to the (20$\bar{2}$1) facet is desired. Accordingly, the sapphire substrate may be selected to have a (22$\bar{4}$3) process surface orientation (e.g., the [22$\bar{4}$3] direction of the sapphire is approximately parallel to the [20$\bar{2}$1] direction of the GaN to be grown). Epitaxial growth of GaN crystals 250 may be initiated using any of the above-described buffer layer and epitaxy processes for gallium-polar semipolar, nitrogen-polar semipolar, or nonpolar GaN (e.g., as described in connection with FIG. 2G, FIG. 2H, and FIG. 3). As the crystals 250 grow, stacking-fault regions 410 may form in the [0001] direction along the (0001) facet, as depicted in FIG. 6A.

Figure 6B:
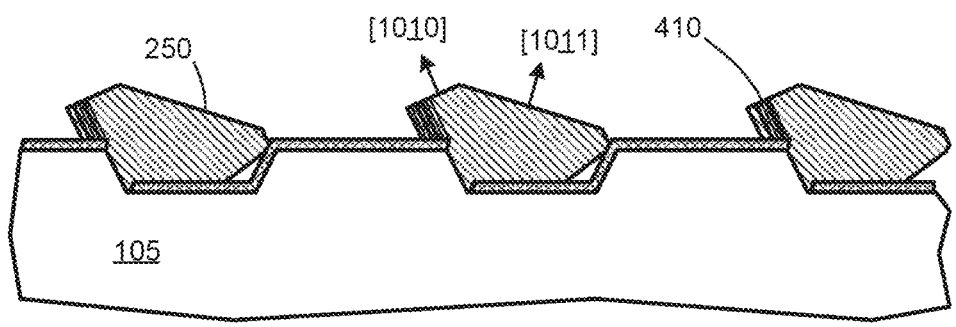
Figure 6C:
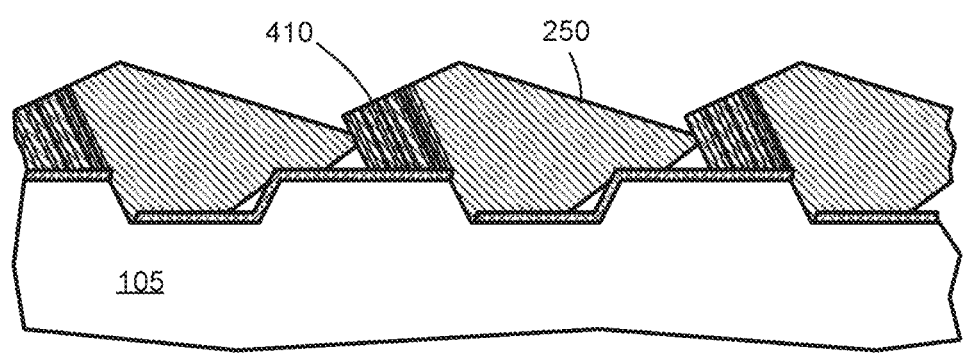
FIG. 6C depicts coalescence of semipolar GaN crystals on a patterned sapphire substrate, according to some embodiments.

As the crystals 250 increase in size, well-defined facets may become readily visible on upper surfaces of the crystals. For the example shown, the (10$\bar{1}$0) and (10$\bar{1}$1) facets may form on the upper surfaces, as illustrated in FIG. 6B. The stacking-fault regions 410 may increase in size as the crystals 250 expand across the PSS substrate 105. The semiconductor that forms in the [0001] direction may have significantly less or negligible stacking faults compared to the semiconductor that forms in the [000$\bar{1}$] direction. In some cases, the epitaxial growth may continue until the crystals 250 coalesce, as depicted in FIG. 6C, however it is not necessary for the crystals 250 to coalesce in the present embodiments.

After the formation of SF regions 410, the substrate and crystals 250 may be subjected to a selective etch that removes the stacking faults and reshapes the crystals. According to some embodiments, the selective etch may be a wet, anisotropic etch that preferentially etches certain facets of a formed crystal 250 and stops on other facets. For example, a wet potassium hydroxide (KOH) etch may be employed. The KOH concentration may be between 5% and 50% KOH in water by weight, or between approximately these values. The KOH solution may be heated to a temperature between 20° C. and 80° C., or between approximately these values. In some implementations, the KOH concentration may be between 20% and 50% KOH, or between approximately these values, in water by weight and the etching temperature may be between 30° C. and 80° C., or between approximately these values. The etching time may be between 1 minute and 60 minutes, depending on the size of the crystals 250, the etchant concentration, and the etching temperature. In some implementations where the same or different crystal orientations may be desired, other etchants may be used such as, but not limited to, sodium hydroxide (NaOH), sulfuric acid ($H_2SO_4$), phosphoric acid ($H_3PO_4$).

Figure 6D:
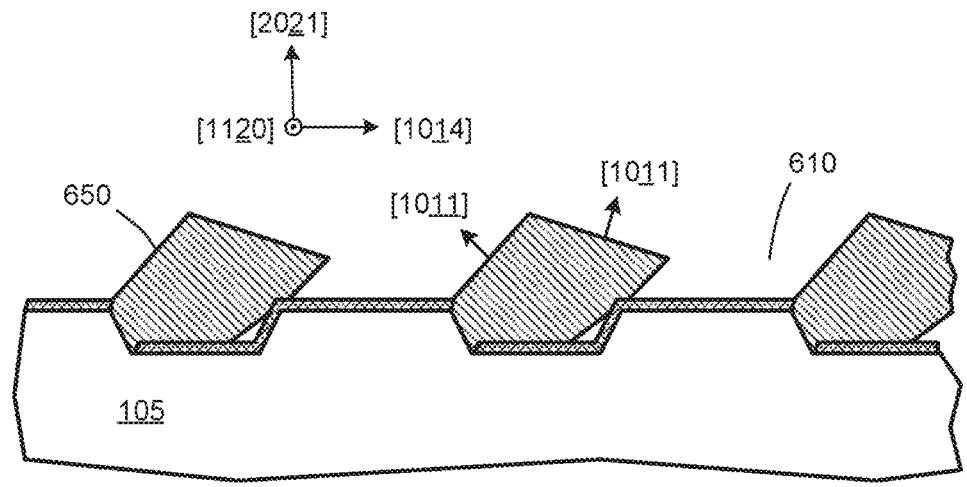
FIG. 6D depicts a structure of epitaxial GaN remaining after etching the coalesced GaN crystals to remove regions with stacking faults, according to some embodiments.

According to some embodiments, the selective etch will stop on certain crystal facets, so that the etch self terminates and the etch-back need not be precisely timed. For example, the KOH etch may rapidly etch the (000$\bar{1}$) facets of the crystals 250 and effectively stop on the (10$\bar{1}$0), (10$\bar{1}$1), and (10$\bar{1}\bar{1}$) facets. In some cases, the etch rates for the (10$\bar{1}$0), (10$\bar{1}$1), and (10$\bar{1}\bar{1}$) facets may be at least ten times slower than the etch rate for the (000$\bar{1}$) facet. A resulting reshaped crystal structure (for gallium-semipolar GaN) may appear as depicted in FIG. 6D. The remaining top-side facets may comprise the (10$\bar{1}$1) facet and the (10$\bar{1}\bar{1}$) facet, according to some embodiments. There may be voids 610 between the reshaped crystals 650.

After the etch back and removal of the SF regions 410, the substrate may be cleaned in deionized water and a selective-growth process may be employed to regrow GaN on the reshaped crystals 650. The selective-growth may comprise a metal-organic chemical vapor deposition (MOCVD) process in which the growth rate of a selected facet is made faster than one or more other growth facets. Since the stacking faults are generated in the (000$\bar{1}$) basal-planes of GaN during initial growth of this facet, it is desirable to reduce or eliminate (000$\bar{1}$) basal-plane growth facet during regrowth in order to get rid of the stacking faults.

According to the theory of kinetic Wulff-plot, during the convex growth of a crystal, the facets with fast growth rates will disappear and the crystal shape will be dominated by the facets with slow growth rates. To extinguish the (000$\bar{1}$) growth facets during the regrowth, the (000$\bar{1}$) growth rate should be increased relative to the growth rate of at least the (10$\bar{1}$1) facet, so that the GaN crystal shape will be dominated by the (10$\bar{1}$1) facet and other slow-growing facets.

The inventors found after numerous trials that changing the MOCVD growth parameters, including temperature, pressure, V/III ratio, and TMGa flow rate could not make the growth rate of the (000$\bar{1}$) facet faster than that of the (10$\bar{1}$1) facet. The (000$\bar{1}$) growth facet always appeared again due to its slowest growth rate among all GaN facets, and the reshaped crystals 650 of semipolar GaN regrew back into the shape depicted in FIG. 6B indicating the presence of the (000$\bar{1}$) growth facet.

Figure 6E:
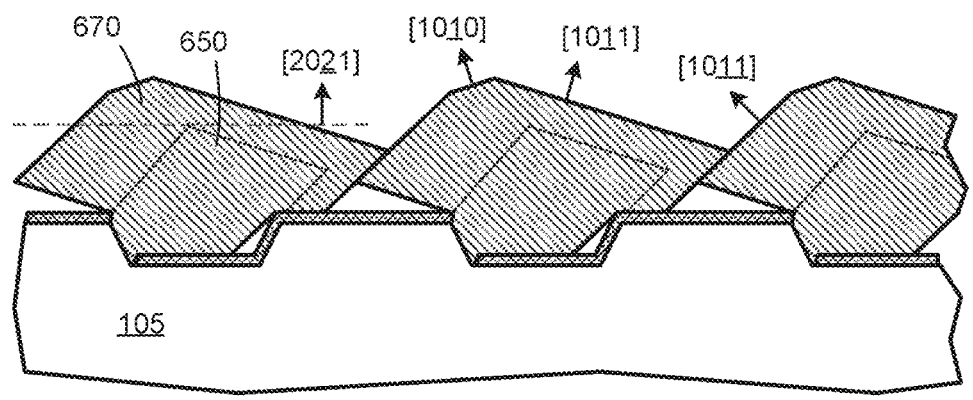
FIG. 6E depicts a regrown, coalesced layer of semipolar GaN, according to some embodiments.
Figure 8:
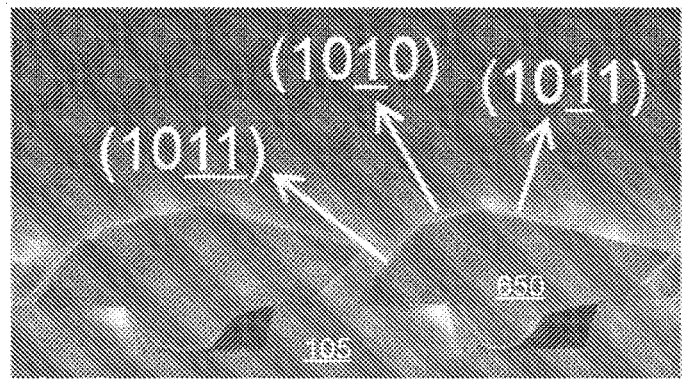
FIG. 8 is a scanning electron micrograph of gallium-polar semipolar GaN regrown on a patterned sapphire substrate where stacking faults associated with growth of the (0001) facet have been eliminated.

The inventors subsequently discovered that adding in some impurity species during regrowth such as, but not limited to, germanium (Ge), can dramatically enhance the growth rate of the N-polar (000$\bar{1}$) growth facet. Other impurity dopants may be used in some cases, such as Si, As, B, P, Sn, or Ga. The resulting regrown crystals can then eliminate growth from a (000$\bar{1}$) facet and form with stable growth facets (10$\bar{1}$1), (10$\bar{1}$0), and (10$\bar{1}\bar{1}$), as illustrated in FIG. 6E. Regrowth or continued growth portions 670 of the crystals may include the impurity dopant. An example SEM image of regrown, gallium-polar semipolar GaN on a PSS is shown in FIG. 8. According to some embodiments, the regrowth may continue until the voids 610 are covered and the reshaped crystals 650 grow until they coalesce.

According to some embodiments, the regrowth may comprise MOCVD and the conditions may be as follows. The regrowth temperature may be between 950° C. and 1070° C., or between approximately these values. The pressure may be between 50 mbar and 400 mbar, or between approximately these values. The TMGa or TEGa flow rate may be between 10 μmol/min and 200 μmol/min, or between approximately these values. The $NH_3$ flow rate may be between 0.5 slm and 5 slm, or between approximately these values. The impurity doping level (e.g., doping level of Ge) may be between $1 \times 10^{17}$ cm$^{-3}$ and $5 \times 10^{19}$ cm$^{-3}$, or between approximately these values. For lower and higher doping levels, stacking faults were observed to form. According to some embodiments, the doping range may be between $1 \times 10^{18}$ cm$^{-3}$ and $1 \times 10^{19}$ cm$^{-3}$, or between approximately these values.

Figure 6F:
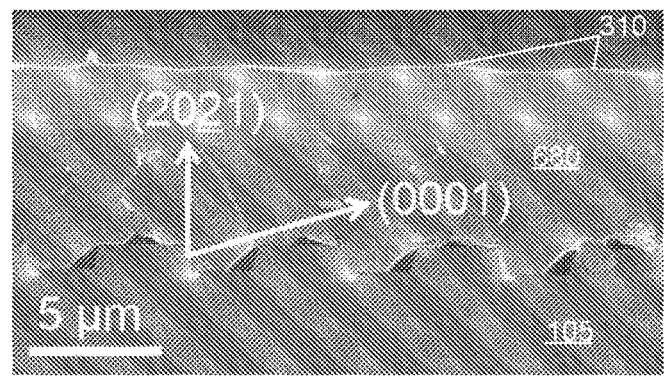
FIG. 6F is a scanning electron micrograph of a regrown, coalesced layer of GaN on a patterned sapphire substrate, according to some embodiments.

After the reshaped crystals 650 coalesce during regrowth, the impurity doping may be discontinued. A thick layer (e.g., between 2 microns and 20 microns) of a desired III-nitride material may then be grown. The resulting epitaxial layer 680 may have ridges 310 as shown in FIG. 6F, but may have a greatly reduced density of SFs compared to the case shown in FIG. 3. For example, the density of SFs for the sample shown in FIG. 3 may be as high as $1 \times 10^6$ cm$^{-2}$, and the density of SFs for epitaxial layers of III-nitride material produced according to the present embodiments may be no more than $10^2$ cm$^{-2}$. According to some embodiments, the substrate may be subsequently planarized (e.g., using chemical-mechanical polishing) to remove the ridges 310 and produce a planar process surface parallel to the (2021) gallium-polar semipolar facet, for example.

Figure 7A:
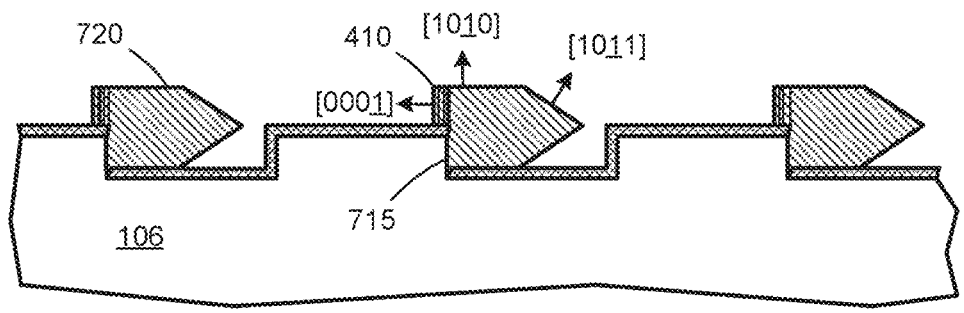
FIG. 7A illustrates that other orientations (e.g., nonpolar) of a III-nitride material may be produced according to the present embodiments.
Figure 7B:
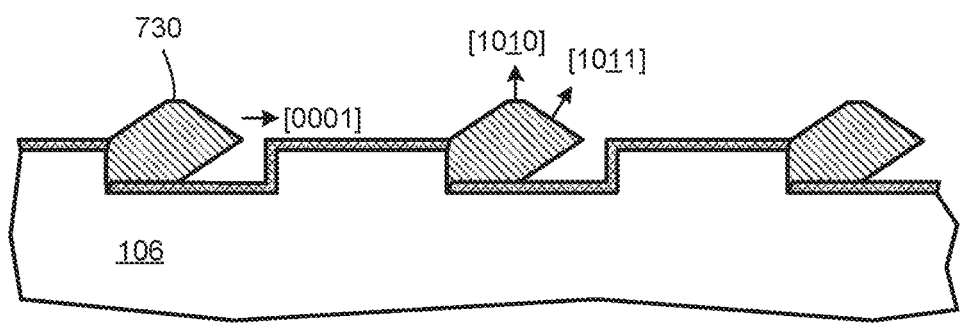
FIG. 7B depicts a structure of epitaxial GaN remaining after etching the material to remove regions with stacking faults, according to some embodiments.
Figure 7C:
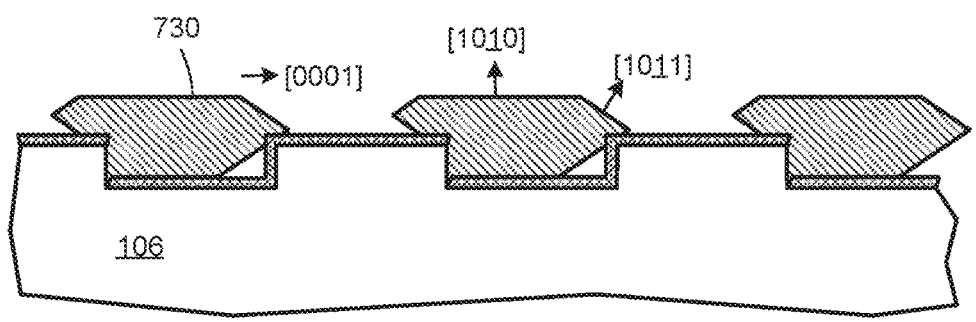
FIG. 7C depicts a regrown layer of nonpolar GaN, according to some embodiments.

As indicated above, other orientations of stacking-fault free III-nitride material may be formed on PSS. FIG. 7A-FIG. 7C show structures associated with forming nonpolar GaN. For a nonpolar orientation, the sapphire substrate 106 may be selected with its c-plane oriented perpendicular to the substrate surface. The substrate 106 may be patterned with vertical sidewalls that are approximately parallel to the sapphire's c-plane. Crystals 720 of nonpolar GaN may be formed as described above from the crystal growth surfaces 715, as depicted in FIG. 7A. As the crystals 720 grow, stacking-fault regions 410 may form in the [0001] direction as the crystal expands over the masked area.

A subsequent etch may be used to remove the stacking-fault regions 410 and reshape the crystals, as depicted in FIG. 7B. The resulting growth facets may comprise the (1011), (1010), and (1011) facets. A subsequent regrowth with an impurity dopant as described above may be carried out to form stacking-fault free crystals 730, as indicated in FIG. 7C. Growth of the stacking-fault free crystals 730 may continue until they coalesce over the PSS. The dopant may be terminated and a thick layer of SF-free, nonpolar GaN may be formed over the substrate 106.

Although two different crystal orientations are shown in FIG. 6E and FIG. 7C, a crystal may be formed in any orientation from polar to nonpolar and a final crystal facet need not be parallel to a process surface of the finished substrate. Any selected crystal facet may be either parallel to or oriented at a desired angle with respect to the process surface. The orientation of the epitaxial crystals is primarily determined by the cut of the sapphire substrate. Although it can be beneficial to have the etched sidewalls 112 of the sapphire substrate parallel to the c-plane facet of the sapphire, the etched sidewalls 112 may be inclined as much as 5 degrees from the sapphire's c-plane facet without appreciably affecting the III-nitride crystal formation.

When nitrogen-polar orientations of a III-nitride material, such as GaN, are formed, SFs may or may not form at the (0001) growth facet. In a nitrogen-polar orientation, the (0001) growth facet may form away from a masked region and not along its surface. Instead, the (0001) growth facet may form along a masked surface and generate stacking faults. Accordingly, an impurity dopant may be used to increase the growth rate of the (0001) growth facet. In some cases, Ge may be added as a dopant within the ranges specified above to eliminate the (0001) growth face.

FIG. 8 is a SEM micrograph showing regrown, stacking-fault free crystals of gallium-polar semipolar GaN on a patterned sapphire substrate 105. The resulting growth facets after etch-back and regrowth with a Ge dopant are the (1011), (1010), and (1011) facets. Other orientations of the sapphire substrate may result in other resulting growth facets. For this example, the periodicity of patterns on the sapphire substrate 105 is approximately 6 microns. Other periodicities may be used in other embodiments. According to some implementations, the periodicity may be nanoscale, e.g., between 20 nm and 500 nm. With smaller periodicity, the portion of the epitaxial layer subjected to etch-back and regrowth with an impurity may be appreciably less than when the periodicity is on the order of 5 microns. A thinner portion of the GaN layer subjected to etch-back and regrowth may result in a lower defect density at the surface of a coalesced epitaxial layer that is microns thick.

Figure 9:
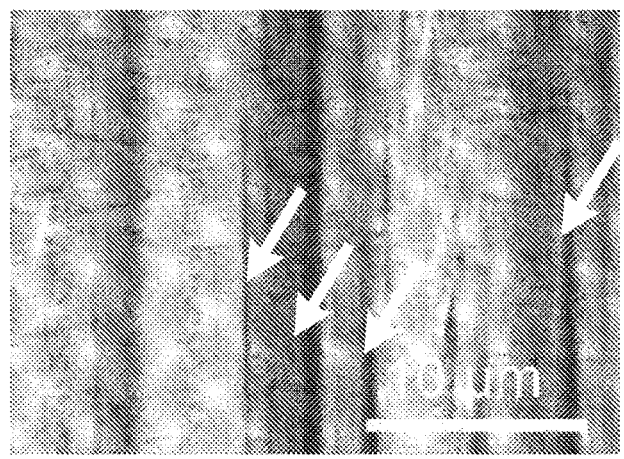
FIG. 9 shows a cathodoluminescence image recorded from a coalesced epitaxial layer of semipolar GaN formed on a patterned sapphire substrate with reduced stacking faults, according to some embodiments.

The crystalline quality of a 7-micron thick epitaxial layer of (2021) GaN (shown in FIG. 6F) was characterized by cathodoluminescence (CL). A plan-view monochromatic CL image at emission wavelength of 365 nm is shown in FIG. 9. This image in comparison with the CL image of FIG. 5 shows that the periodic pattern of stacking faults (dark bands running across the GaN layer) is not present. The image of FIG. 9 shows some short discrete dark lines marked by white arrows, which are probably associated with clusters of threading dislocations created at the interface between GaN and the sapphire substrate. The CL image of FIG. 9 shows a significant reduction in stacking faults and other defects in the epitaxial GaN.

The sample produced for FIG. 9 was prepared under the following conditions. Initial crystal growth from crystal growth surfaces of the PSS covered by a LT GaN buffer layer was carried out using a MOCVD reactor at a pressure of approximately 200 mbar. The growth temperature was approximately 1030° C. The TMGa flow rate was approximately 100 μmol/min and the NH$_3$ flow rate was approximately 1 slm.

The crystals were subjected to a KOH etch for which the KOH concentration was approximately 10% KOH in water by weight and the etching temperature was approximately 40° C. The etching time was 40 minutes.

Crystal regrowth was carried out using a MOCVD reactor at a pressure of 100 mbar. The growth temperature was approximately 1030° C. The TMGa flow rate was approximately 160 μmol/min and the NH$_3$ flow rate was approximately 1 slm. The Ge impurity doping level was approximately $5 \times 10^{18}$ cm$^{-3}$.

Figure 10A:
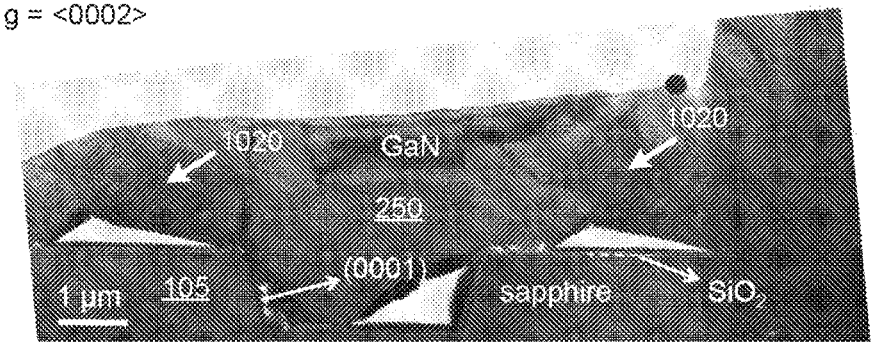
FIG. 10A is a transmission electron micrograph taken with a diffraction vector of <0002>.
Figure 10B:
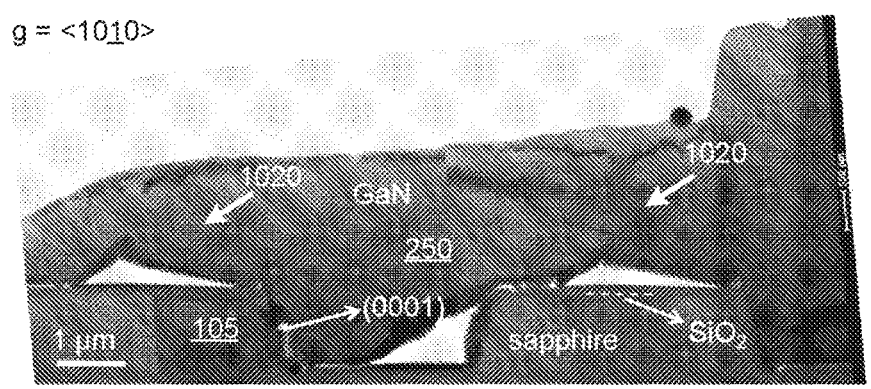
FIG. 10B is a transmission electron micrograph taken with a diffraction vector of <1010>.

Epitaxial samples of the (2021) GaN were also examined using transmission electron microscopy to assess the presence of stacking faults. TEM micrographs are shown in FIG. 10A and FIG. 10B. The images are bright-field TEM images that include the regrown Ge-doped (2021) GaN under two-beam condition with diffraction vectors of <0002> and <1010>, respectively. Normally, basal plane stacking faults would be visible with the g vector of <1010> and invisible with g vector of <0002>. However, basal plane stacking faults are not visible in the GaN. The regrown Ge-doped GaN exhibits dark contrast in regrowth regions 1020 that are indicated by the white arrows. These regions contain impurity dopants and are located near the surface of the PSS. These darkened regions are visible in both g vector orientations. These regrowth regions 1020 suggest that defects may be generated by the Ge-doping during regrowth. These defects may be Ge precipitates, similar to arsenic precipitates observed in GaAs grown at low temperature. However, there are no stacking faults observed in regions above the Ge-doped GaN except some threading dislocations. These results suggest that stacking-fault-free GaN of various orientations may be formed on patterned sapphire substrates.

Although the methods and embodiments described above include steps of initial crystal growth, etch-back to remove stacking faults due the lateral growth of N-polar (0001) GaN facet over a heterogeneous surface and to reshape the initial crystals, and further growth of the reshaped crystals with an impurity dopant, the inventors have recognized and appreciated that the etch-back process may be omitted in some cases. In some embodiments, the initial growth of crystals (e.g., crystals 250 in FIG. 6A) on a PFS with a suitable buffer layer may be carried out with an impurity dopant such as Ge. Initial growth with the impurity dopant may eliminate the (0001) growth facet quickly and prevent the stacking fault regions 410 from forming during the initial stages of crystal growth. Instead, the initial crystals may form with the (1011), (1010), and (1011) facets as depicted in FIG. 6D. Growth with the impurity dopant may continue until the crystals coalesce, as depicted in FIG. 6E for example. Instead of more distinctly visible regrowth regions 1020 that indicate the formation of defects due to the dopant, an initial portion of the epitaxial layer that includes the initial growth crystals may all be doped with the impurity dopant and appear the same in the TEM. After the growth crystals coalesce, the dopant may be discontinued for subsequent III-nitride growth that is essentially free of stacking faults.

Figure 11:
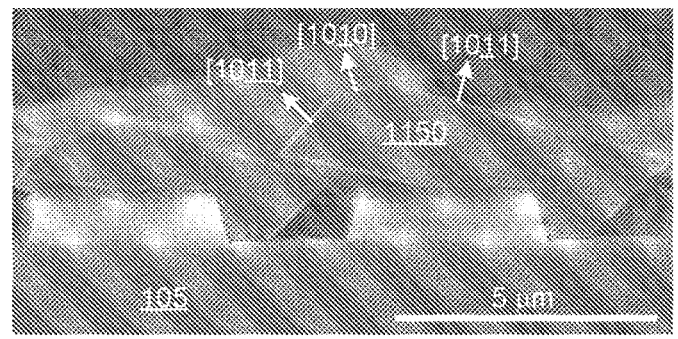
FIG. 11 is a scanning electron micrograph of gallium-polar semipolar GaN grown on a patterned sapphire substrate where stacking faults associated with growth of the (0001) facet have been eliminated and no etch-back process was used.

The SEM image in FIG. 11 shows semipolar GaN crystals 1150 formed on a PSS where the initial growth of the crystals has been carried out with a Ge dopant. The growth conditions comprised MOCVD with a chamber pressure of approximately 200 mbar and a temperature of approximately 1030° C. The TMGa flow rate was approximately 25 sccm and the $NH_3$ flow rate was approximately 1 slm. The Ge impurity doping level was approximately $5 \times 10^{18}$ cm$^{-3}$. In some embodiments, the chamber pressure may be between 100 mbar and 300 mbar, or approximately between these values. The temperature during growth may be between, or approximately between 1000° C. and 1050° C., or approximately between these values. The TMGa flow rate may be between 60 µmol/min and 160 µmol/min, or approximately between these values. The $NH_3$ flow rate may be between 1 slm and 3 slm, or approximately between these values. According to some embodiments, the Ge impurity doping level may be between $1 \times 10^{18}$ cm$^{-3}$ and $2 \times 10^{19}$ cm$^{-3}$, or between approximately these values.

The crystal structure shown in FIG. 11 is similar to that shown in FIG. 6E, even though no etch-back process has been used. The result indicates that SFs in the semipolar growth of a III-nitride material on a patterned sapphire substrate may be effectively eliminated using impurity additives during crystal growth with no ex-situ etching to remove regions containing stacking faults and no crystal regrowth step. After the crystals 1150 coalesce, the impurity dopant may be discontinued to form a continuous epitaxial layer that is substantially free of stacking faults. The epitaxial layer may be planarized (e.g., using a CMP process) to produce a flat process surface suitable for microfabrication of integrated circuits.

The structures and methods described above for growing III-nitride materials may be used to form nitrogen-polar semipolar or gallium-polar semipolar GaN on patterned sapphire substrates. The resulting structures can be mass-produced using some standard techniques such as MOCVD, etching, chemical-mechanical polishing, etc., and may be scaled to different substrate sizes. These processes can avoid expenses associated with trying to grow bulk GaN crystals and produce wafers from such boules. Conventionally, nitrogen-polar semipolar GaN can only be produced by slicing expensive bulk GaN substrates, with limited availability and sizes. The structures and methods described above may enable the synthesis of nitrogen-polar semipolar GaN planes on relatively inexpensive sapphire substrates, which are commercially mature and widely available.

Although the structures and methods described above primarily relate to forming gallium-polar semipolar (2021) GaN and nitrogen-polar semipolar (2021) GaN epitaxial layers, the methods may be used to form other semipolar facet orientations. For example, nonpolar (1120), and (1010), as well as semipolar (1011), (1011), (1122), (1122) may be grown using a patterned sapphire substrate with different crystallographic orientations. Virtually any crystal orientation in an epitaxial layer may be possible by using a correctly sliced sapphire substrate.

Although epitaxial growth of semipolar and nonpolar GaN have been described, semipolar and nonpolar orientations of other III-nitride materials (e.g., (Al, In, Ga)N) may be grown according to some embodiments. The structures and methods may also be used to form various semipolar and nonpolar III-nitride alloys that include GaN (e.g., AlGaN, InGaN, InAlGaN). In some cases, a different material may be grown after the initial crystals coalesce. For example, the initial crystals may be GaN and a III-nitride alloy may be grown over the crystals after they coalesce. In some implementations, a portion or all of an epitaxially-grown layer may be doped to have n-type or p-type conductivity, so that integrated circuit devices such as transistors, diodes, thyristors, LEDs and laser diodes can be fabricated in the epitaxial layer. Doping may be done during epitaxial growth in some cases, and/or after growth (e.g., using ion implantation into the epilayer).

Nitrogen-polar semipolar GaN planes may provide solutions to light-emitting diode (LED) challenges such as "efficiency droop" (LED efficiency drops as the injection current increases) and "green gap" (LED efficiency drops as the emission wavelength increases from blue to green to yellow). Nonpolar or semipolar GaN may be a useful candidate for the reduction of efficiency droop and improving efficiency of longer wavelength light-emitting diodes. The ability to design devices with wide quantum wells (QWs), without suffering from efficiency degradation due to the quantum-confined Stark effect, may enable high efficiencies at high carrier densities due to an increased active volume. For example, the semipolar (2021) orientation has recently appeared to be a leading candidate for high efficiency and long wavelength LEDs and laser diodes (LDs), ever since the initial demonstration of a green LD in 2009. Further investigations in semipolar orientations have yielded results showing the (2021) orientation to have beneficial properties over the (2021) orientation for carrier transport and efficiency droop. As can be shown by calculations, the polarization field for the (2021) orientation points in a direction opposite to its (2021) counterpart. With the much reduced polarization field (approximately 25% of Ga-polar GaN), this direction of polarization field is of the same order of magnitude and opposite to the built-in junction field, allowing the band profile in QWs fabricated in (2021) GaN to be closer to flat-band condition. This can increase the electron overlap, improve the radiative efficiency, and improve the droop characteristics. In addition, the (2021) orientation displays increased InGaN homogeneity, enhanced indium incorporation at higher temperatures yielding higher active layer quality, improved transport properties enabling enhanced uniformity of carrier concentration between QWs, and reduced thermal droop. Such characteristics make nitrogen-polar semipolar GaN highly desirable for integrated device fabrication.

CONCLUSION

The terms "approximately" and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately" and "about" may include the target dimension.

Selective etching, as used herein, comprises subjecting a substrate to an etchant that preferentially etches at least one material at a faster rate than a second material. In some cases, the second material may be formed as a hard mask (e.g., an inorganic material such as an oxide, nitride, metal, or the like) or soft mask (e.g., a photoresist or polymer). In some embodiments, the second material may be part of a device structure that has different material characteristics than the first material (e.g., doping density, material composition, or crystal structure). The etch may be a dry etch or wet etch.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

Although the drawings typically depict a small portion of an epitaxially-grown III-nitride layer, it will be appreciated that a large area or entire substrate may be covered with such an epitaxially-grown layer. Further, the epitaxial layer may be planarized (e.g., by chemical-mechanical polishing) and integrated-circuit devices (e.g., transistors, diodes, thyristors, light-emitting diodes, laser diodes, photodiodes and the like) may be fabricated using the epitaxially-grown material. In some embodiments, the integrated-circuit devices may be used in consumer electronic devices such as smart phones, tablets, PDA's, computers, televisions, sensors, lighting, displays, as well as application-specific integrated circuits.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for forming an epitaxial layer of III-nitride material on a patterned foreign substrate, the method comprising:

receiving the patterned foreign substrate having separated III-nitride crystals formed thereon; and further growing the III-nitride crystals to include an impurity dopant; and eliminating a crystal growth facet on the further grown III-nitride crystals that forms stacking faults.

2. The method of claim 1, wherein further growing the III-nitride crystals comprises growing GaN or an alloy of GaN.

3. The method of claim 2, wherein the GaN or the alloy of GaN has a semipolar orientation approximately parallel to a process surface and wherein the semipolar orientation is within 60 degrees of a nonpolar facet.

4. The method of claim 2, wherein further growing the III-nitride crystals comprises using Ge as the impurity dopant to dope the GaN or the alloy of GaN with a dopant density between approximately $1\times10^{18}$ cm$^{-3}$ and approximately $1\times10^{19}$ cm$^{-3}$.

5. The method of claim 2, wherein further growing the III-nitride crystals comprises metal-organic chemical vapor deposition of the GaN or the alloy of GaN on the separated III-nitride crystals.

6. The method of claim 5, wherein a flow rate of NH$_3$ gas during the deposition is between approximately 0.5 slm and approximately 5 slm.

7. The method of claim 5, wherein a flow rate of trimethylgallium or triethylgallium gas during the deposition is between approximately 10 mol/min and approximately 200 mol/min.

8. The method of claim 5, wherein a temperature during the deposition is between approximately 950° C. and approximately 1070° C.

9. The method of claim 5, wherein a pressure during the deposition is between approximately 50 mbar and approximately 400 mbar.

10. The method of claim 1, wherein further growing the III-nitride crystals comprises using Ge as the impurity dopant.

11. The method of claim 1, wherein the crystal growth facet that is eliminated is a (0001) facet of GaN.

12. The method of claim 1, further comprising:

continuing the growth of the III-nitride crystals until the separated III-nitride crystals coalesce into a continuous layer across the patterned foreign substrate; and further growing the III-nitride crystals without the impurity dopant.

13. The method of claim 12, further comprising planarizing the continuous layer to form a process surface on the epitaxial layer.

* * * * *

UNITED STATES PATENT AND TRADEMARK OFFICE
CERTIFICATE OF CORRECTION

PATENT NO. : 10,896,818 B2
APPLICATION NO. : 16/324979
DATED : January 19, 2021
INVENTOR(S) : Jung Han et al.

Page 1 of 1

It is certified that error appears in the above-identified patent and that said Letters Patent is hereby corrected as shown below:

In the Claims

At Column 22, Lines 29 and 30, Claim 7, before "mol/min" insert -- µ --

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*